United States Patent
Kidambi

(10) Patent No.: US 8,063,803 B2
(45) Date of Patent: *Nov. 22, 2011

(54) CALIBRATION OF OFFSET, GAIN AND PHASE ERRORS IN M-CHANNEL TIME-INTERLEAVED ANALOG-TO-DIGITAL CONVERTERS

(75) Inventor: Sunder S. Kidambi, Austin, TX (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/950,751

(22) Filed: Nov. 19, 2010

(65) Prior Publication Data

US 2011/0063149 A1    Mar. 17, 2011

Related U.S. Application Data

(63) Continuation of application No. 12/691,449, filed on Jan. 21, 2010, now Pat. No. 7,839,313, and a continuation of application No. 12/419,599, filed on Apr. 7, 2009, now Pat. No. 7,839,323, said application No. 12/691,449 is a continuation of application No. 12/419,599, filed on Apr. 7, 2009, now Pat. No. 7,839,323.

(60) Provisional application No. 61/233,571, filed on Aug. 13, 2009, provisional application No. 61/141,086, filed on Dec. 29, 2008.

(51) Int. Cl.
    *H03M 1/06* (2006.01)
(52) U.S. Cl. ........................................ 341/118; 375/232
(58) Field of Classification Search .......... 341/118–155; 375/232, 316
    See application file for complete search history.

(56) References Cited

U.S. PATENT DOCUMENTS

| 7,336,729 B2 * | 2/2008 | Agazzi .......................... 375/316 |
| 7,501,967 B2 * | 3/2009 | Draxelmayr et al. ......... 341/141 |

(Continued)

OTHER PUBLICATIONS

Goodman, J., et al., "Polyphase Nonlinear Equalization of Time-Interleaved Analog-to-Digital Converters," IEEE Journal of Selected Topics in Signal Processing 3(3):362-373, Jun. 2009.

(Continued)

*Primary Examiner* — Lam T Mai
(74) *Attorney, Agent, or Firm* — Hamilton, Brook, Smith & Reynolds, P.C.

(57) ABSTRACT

Techniques for correcting component mismatches in an M-channel time-interleaved Analog to Digital Converter (ADC). In order to obtain an error measure for offset, gain or phase, errors, outputs from each ADC are either summed or averaged over $N_o$ samples. Calling each of the sums or averages as $X_k$ where $k=1, 2, \ldots, M$, there are M such values as a result. A single value representing the mean of these M values, $X_{mean}$, is chosen as a reference value. The offset, gain and phase errors for the M different ADCs are then obtained from $X_k - X_{mean}$. The sign of each offset error, i.e., sign $(X_k - X_{mean})$, is then used to drive an adaptive algorithm whose output represents an offset correction value for the corresponding ADC. The offset, gain, and phase correction outputs from the adaptive algorithm is fed to an array of Digital-to-Analog converters (DACs) whose outputs are voltages or currents that directly or indirectly controls the offset, gain or phase setting of each individual ADC. Thus, there are M different offset, gain and phase error signals and M different adaptive algorithms operating in conjunction with M different DACs providing offset control signals to M different ADCs. In certain embodiments, spur frequencies can be reduced with the use of notch filters.

26 Claims, 32 Drawing Sheets

U.S. PATENT DOCUMENTS 7,551,114 B2 * 6/2009 Joy et al. .................. 341/161
7,693,214 B2 * 4/2010 Shida ........................ 375/232

OTHER PUBLICATIONS

Jamal, S.M., et al., "Calibration of Sample-Time Error in a Two-Channel Time-Interleaved Analog-to-Digital Converter," pp. 1-29, Oct. 8, 2003.

Khoini-Poorfard, R., et al., "Time-Interleaved Oversampling A/D Converters: Theory and Practice," IEEE Transactions on Circuits and Systems—II: Analog and Digital Signal Processing 44(8): 634-645. Aug. 1997.

Takashi, O., et al., "Novel Sampling Timing Background Calibration for Time-Interleaved A/D Converters," 2009 52nd IEEE International Midwest Symposium on Circuits and Systems, pp. 361-364, Aug. 2-5, 2009.

\* cited by examiner

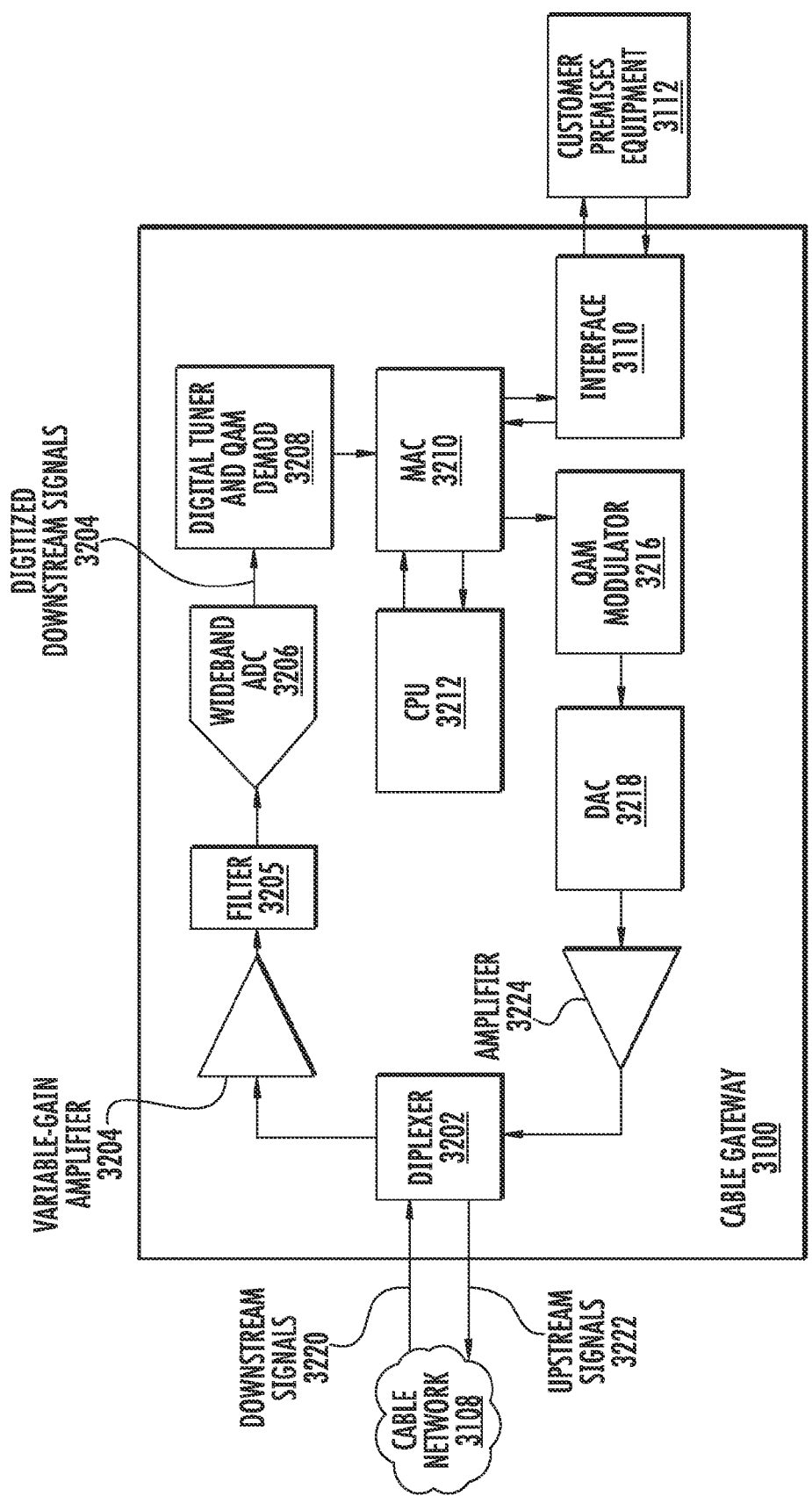

US 8,063,803 B2

CALIBRATION OF OFFSET, GAIN AND PHASE ERRORS IN M-CHANNEL TIME-INTERLEAVED ANALOG-TO-DIGITAL CONVERTERS

CROSS REFERENCE TO RELATED APPLICATIONS

This application is a continuation of U.S. application Ser. No. 12/691,449, filed Jan. 21, 2010, now U.S. Pat. No. 7,839,313 which claims the benefit of U.S. Provisional Application No. 61/233,571, filed on Aug. 13, 2009. This application is a continuation of U.S. patent application Ser. No. 12/419,599, filed Apr. 7, 2009, now U.S. Pat. No. 7,839,323 which claims the benefit of U.S. Provisional Application No. 61/141,086, filed on Dec. 29, 2008. U.S. application Ser. No. 12/691,449 is also a continuation of U.S. application Ser. No. 12/419,599 filed Apr. 7, 2009 now U.S. Pat. No. 7,839,323. The entire teachings of the above applications are incorporated herein by reference.

BACKGROUND OF THE INVENTION

An efficient way of providing very high sample rates, rates that cannot be provided by a single Analog-to-Digital Converter (ADC), is to use a parallel connection of slower ADCs operating in a time-interleaved fashion. An M-channel time-interleaved ADC (MCTIADC) comprises of M ADCs, each operating at a sample rate that is 1/M of the overall system sample rate. In the absence of any impairments or mismatch errors between the ADCs, i.e., assuming all the ADCs are either ideal or have exactly the same characteristics, the output samples appear at equally spaced intervals in a manner that creates a seamless image of a single ADC operating at the system sample frequency.

In practice, however, there are component mismatches between the different ADCs that severely degrade the performance of the MCTIADC system. The commonly occurring mismatches are offset, gain and uniform sample instants. In other words, the offsets and gains of all the ADCs are not the same and the ADCs do not sample at uniform sample instants of the system sample frequency. These mismatches give rise to unnecessary frequency tones or spurs in the spectrum of the signal that significantly reduce the performance of the MCTIADC system. A typical variation of Signal-to-Noise ratio (SNR) is shown in FIG. 1 wherein a tone is swept from a low frequency to almost half the sample rate of the MCTIADC system for various mismatch errors. As can be seen from the figure, the performance of the four-channel ADC is severely hampered due to these errors. Hence, it becomes imperative to estimate and correct these errors to improve the performance of the MCTIADC system.

Herein are shown techniques to minimize the effects of offset, gain and sample-time mismatches by appropriately estimating and correcting these errors in an adaptive manner. In addition, also shown is that the adaptive method can be used in a blind mode wherein the use of any particular calibration signal is circumvented. In other words, the input signal itself serves as the calibrating signal to estimate and correct the mismatch errors.

SUMMARY OF THE INVENTION

This invention generally deals with the estimation and correction of offset, gain and timing errors in an M-channel time-interleaved Analog-to-Digital Converter (MCTIADC). The offset errors which manifest due the difference in errors between the individual ADCs produce spurious frequency content in the spectrum, are called the offset spurs. Assuming that $F_s$ is the sampling frequency of the MCTIADC system, each ADC samples at the rate of $F_s/M$ and the offset spurs are produced at $kF_s/M$ frequencies irrespective of the frequency or amplitude of the input signal, as can be seen in FIG. 3 for a four-channel time-interleaved ADC. Stated in different words, the offset spurs appear at multiples of the sampling frequency of any single ADC. In order to obtain an error measure for the offset errors, output from each ADC is either summed or averaged over $N_o$ samples. Call each of the sum or average as $X_k$ where $k=1, 2, \ldots, M$. As can be noticed, there are M such values as a result of the summing or averaging operation over the M channels. A single value representing the mean of these M values, say $X_{mean}$, is chosen as a reference offset value. The offset errors for the M different ADCs are obtained as $X_k - X_{mean}$. The sign of each offset error, i.e., sign $(X_k - X_{mean})$, is used to drive an adaptive algorithm whose output represents an offset correction value for the corresponding ADC. The output from the adaptive algorithm is fed to a Digital-to-Analog converter (DAC) whose output is a voltage or current that directly or indirectly controls the offset setting of each ADC. Thus, there are M different offset error signals and M different adaptive algorithms operating in conjunction with M different DACs providing offset control signals to M different ADCs.

The differences in the gain values of the ADCs produce an unwanted signal called the gain spurs. The frequencies of these spurs are $\pm F_{in} + kF_s/m$ where $F_{in}$ represents a set of frequencies of the input signal. As can be seen from FIG. 1, the SNR variation is independent of the input signal frequencies $F_{in}$. It, however, depends on the amplitude of the input signal. In order to obtain the gain error of each ADC, a certain window of length $N_g$ samples is assumed. Each of the $N_g$ samples from the output of each ADC are squared, and then a sum or average of these values is obtained from each ADC. Call each of the sums or averages as $Y_k$ where $k=1, 2, \ldots, M$. A single value representing the mean of these M values, say $Y_{mean}$, is chosen as a reference gain value. The gain errors for the M different ADCs are obtained as $Y_k - Y_{mean}$. The sign of each gain error, i.e., sign $(Y_k - Y_{mean})$, is used to drive an adaptive algorithm whose output represents a gain correction value for the corresponding ADC. The output from the adaptive algorithm is fed to a DAC whose output is a voltage or current that directly or indirectly controls the gain setting of each ADC. Thus, there are M different gain error signals and M different adaptive algorithms operating in conjunction with M different DACs providing gain control signals to M different ADCs.

The non-uniformity of the sampling instants of each ADC with respect to the system sampling instants of the MCTIADC gives rise to sampling or phase spurs. These spurs occur at the same frequencies as those due to the gain error. However, spurs due to the gain errors are orthogonal to those due to phase errors. In order to obtain the phase error, one first obtains the correlation between the samples of two adjacent ADCs. In other words, the samples of $ADC_1$ are correlated with the samples of $ADC_2$, samples of $ADC_2$ are correlated with the samples of $ADC_3$, and so on. The samples of $ADC_M$ are correlated with samples of $ADC_1$ in the following cycle. These correlations are summed or averaged over a certain number of samples, $N_p$. If $Z_k$ denotes the sum or average of any correlation and $Z_{mean}$ denotes the average of $Z_k$, a phase error for any ADC can be formed as $Z_k - Z_{mean}$. As in the case of offset and gain, $Z_{mean}$ assumed to be the reference phase value. Again, the sign of each phase error, i.e., sign $(Z_k - Z_{mean})$, is used to drive an adaptive algorithm whose output represents a phase correction value for the corresponding ADC. The output from the adaptive algorithm is fed to a DAC whose output is a voltage or current that directly or indirectly controls the phase setting of each ADC. Thus, there are M different phase error signals and M different adaptive algorithms operating in conjunction with M different DACs providing phase control signals to M different ADCs.

As mentioned above, the spur frequencies for gain and phase appear at $\pm F_{in}+kF_s/M$. If one of the signal components of $F_{in}$ is equal to $$\frac{kF_s}{2M},$$

then it would be impossible to distinguish between that tone and the spur due to gain and phase mismatches. As a consequence of this, the algorithms for gain and phase correction tend to diverge. In order to circumvent this problem, a notch filter is introduced at the output of the ADC that will notch out these frequencies. The output from each notch filter is then used to evaluate the gain and phase errors, as mentioned above.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 32 is an example communication device that may use the MCTIADC.

DETAILED DESCRIPTION OF THE INVENTION

A description of example embodiments of the invention follows.

A preferred embodiment deals with the estimation and correction of offset, gain and timing or phase mismatch errors in an M-channel Time-Interleaved Analog-to-Digital (MCTIADC) system. The estimation is done in the digital domain while the correction is performed in the analog domain. The various errors are estimated by performing signal processing operations on the output of all the ADCs while corresponding correction values are communicated to all the ADCs through Digital-to-Analog Converters (DACs). The output of each ADC is optionally passed through a notch filter to circumvent certain conditions in the input signal that will cause the algorithms to diverge. The details of the notch filter and its usefulness will be deferred to a later section below. The DACs provide appropriate voltages or currents and control either directly or indirectly the correction of each of the ADCs for the different mismatch errors.

Figure 1:
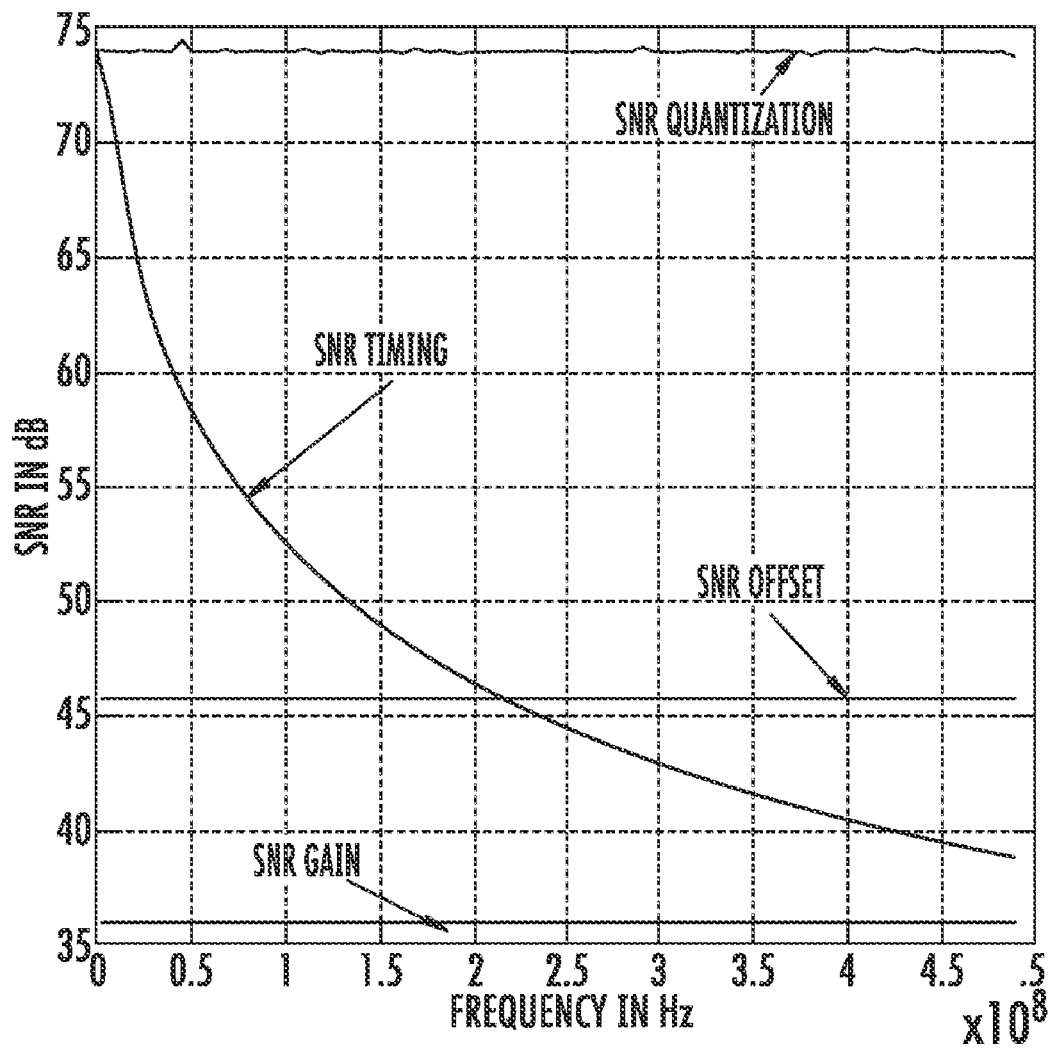
FIG. 1 illustrates SNR variation with input frequency of a typical Four-channel Time-Interleaved Analog-to-Digital Converter for various mismatch errors.
Figure 2:
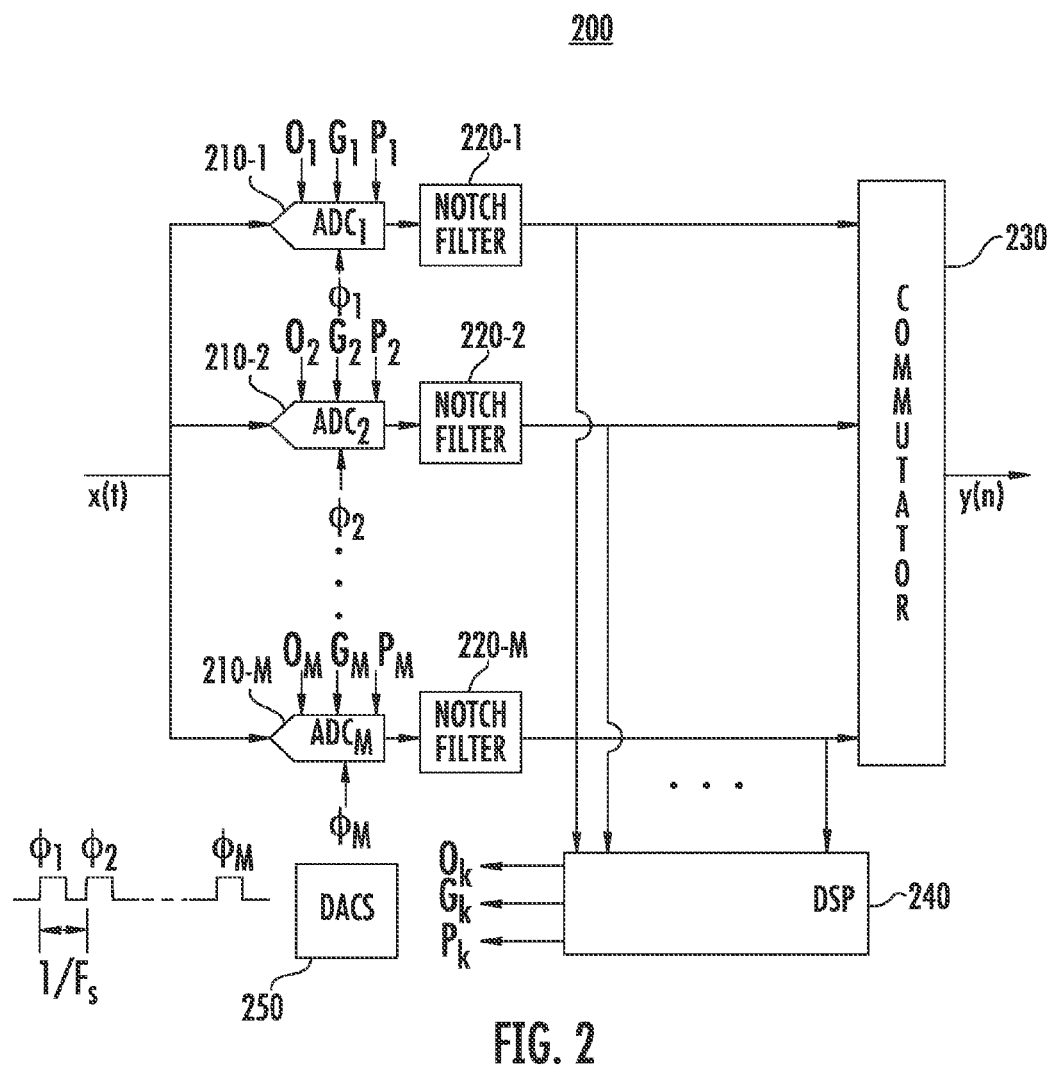
FIG. 2 is a schematic representing the M-channel Time-Interleaved Analog-to-Digital Converter (MCTIADC).

FIG. 2 shows a schematic of an MCTIADC 200 wherein each of the M ADCs (210-1, 210-2, ..., 210-M) is operating at a sampling rate of $F_s/M$ and clocked at the appropriate respective phase $\phi_k$, for k=1 to M.

The commutator 230 operates at the sample rate $F_s$ and circles through the output of every ADC 210 to provide output y(n) at $F_S$. Outputs from each ADC 210 are input to a digital signal processor (DSP) 240 that performs the estimation of all the errors and provides analog outputs corresponding to offset, gain, and phase correction, represented by, $O_k$, $G_k$, and $P_k$, respectively, to a corresponding one of the ADCs 210. Each of the ADCs may implement an offset, gain and phase correction as provided at the $O_k$, $G_k$, and $P_k$, inputs, respectively, and may be implemented according to the charge domain pipeline ADCs described in the co-pending U.S. patent application Ser. No. 12/419,599, filed Apr. 7, 2009 already incorporated by reference above.

Also shown in FIG. 2 are the DACs 250 which convert the offset, gain and phase corrections $O_k$, $G_k$, and $P_k$ to analog voltages before they are fed to the respective inputs of the ADCs 210. The DACs 250, of which there are 3×M in total (three DACs for each of the O, G, and P inputs to each of the M ADCs) can be implemented with any convenient circuit design to convert a digital input to an analog voltage, such as resistive ladder(s), look up table(s), amplifier(s), etc. that meets the desired clock rate and accuracy requirements. The DACs 250 and the optional notch filters 220 are described in more detail below.

Below is a detailed description of the estimation of offset, gain, and phase mismatch errors using the outputs of each ADC and their correction using adaptive algorithms that are performed within the DSP 240.

Offset Correction

Figure 3:
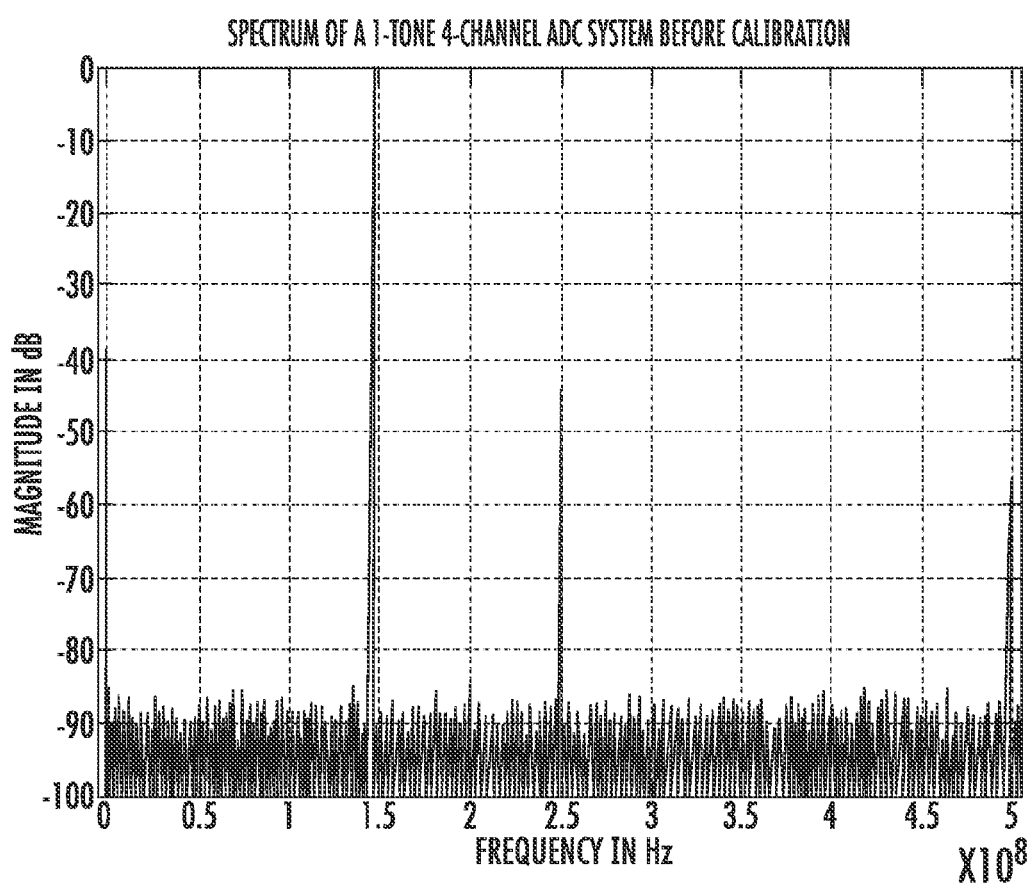
FIG. 3 is a spectrum of a single tone signal with offset mismatch error before correction in a four-channel time-interleaved ADC.

Due to different offset values of the ADCs, offset spurs show up at $kF_S/M$ frequencies. FIG. 3 shows the spectrum of a tone in a four-channel time-interleaved ADC sampling at 1 GHz where the offset spurs appear at fixed frequencies of 250 MHz and 500 MHz. In order to minimize the amplitude of these spurs, the offsets of each ADC must be determined. Towards this end, define $$X_k = \frac{1}{N_o} \sum_{n=0}^{N_o-1} x_k(n) \tag{1}$$

where $x_k(n)$ represents the samples from $ADC_k$, $N_o$ is the number of samples collected to obtain the average $X_k$ and $k=1, 2, \ldots, M$. Let $$X_{mean} = \frac{1}{M} \sum_{k=1}^{M} X_k \tag{2}$$

Now define an offset error for each ADC as $$E_k^{offset} = X_k - X_{mean} \tag{3}$$

for $k=1, 2, \ldots, M$. It can be seen from the above equation that $X_{mean}$ provides an overall reference value in each iteration so that an adaptive algorithm can be used to minimize $E_k^{offset}$.

Now it is possible to provide an adaptive algorithm to correct the offset error in each ADC based on $E_k^{offset}$, for $k=1, 2, \ldots, M$.

Let $ODAC_k$ be the one of the DACs 250 that provides the offset correction input $O_k$ to $ADC_k$. Let $R_o$ be the size of the $ODAC_k$. For example, for an 8-bit $ODAC_k$, $R_O=2^8=256$. A step size that controls the convergence of the adaptive algorithm is denoted by $\mu_k^i$ for $ADC_k$ at the i th iteration. The value of $\mu_k^i$ is constrained to be in the range $[\mu_k^{offsetmin}, \mu_k^{offsetmax}]$. Let $O_k^j$ be the j th value input to the $ODAC_k$. For example, for an 8-bit $ODAC_k$, the values of $O_k^i$ can vary between $[-128, 127]$ or between $[0, 255]$. The constant $O_{bias}$ is a value that allows the correction to be done with respect to a certain value. For instance, $O_{bias}=R_o/2=128$ when the input to the $ODAC_k$ lies in the range $[0, 255]$. On the other hand when the range of the $ODAC_k$ input values is $[-128, 127]$, $O_{bias}$ can assume a value of zero. Let $\alpha_k^i$ denote a variable that provides correction to the $ODAC_k$ input $O_k^i$ associated with $ADC_k$ at the i th iteration. It is now possible to write the adaptive algorithm for offset correction as $$O_k^i = O_{bias} + \text{round}(\alpha_k^i) \tag{4}$$

$$\alpha_k^{i+1} = \alpha_k^i + \text{sign}(E_k^{offset})\mu_k^i \tag{5}$$

$$\mu_k^{i+1} = \max\left(\frac{\mu_k^i}{2}, \mu_k^{offset\ min}\right) \text{ for } i = r_k \tag{6}$$

where $\alpha_k^0=0$, $\mu_k^0=\mu_k^{offsetmax}$, and $r_k$ is any arbitrary positive number. The convergence can be controlled by $\mu_k^i$ by changing its value at every $r_k$ th iteration.

Figure 4:
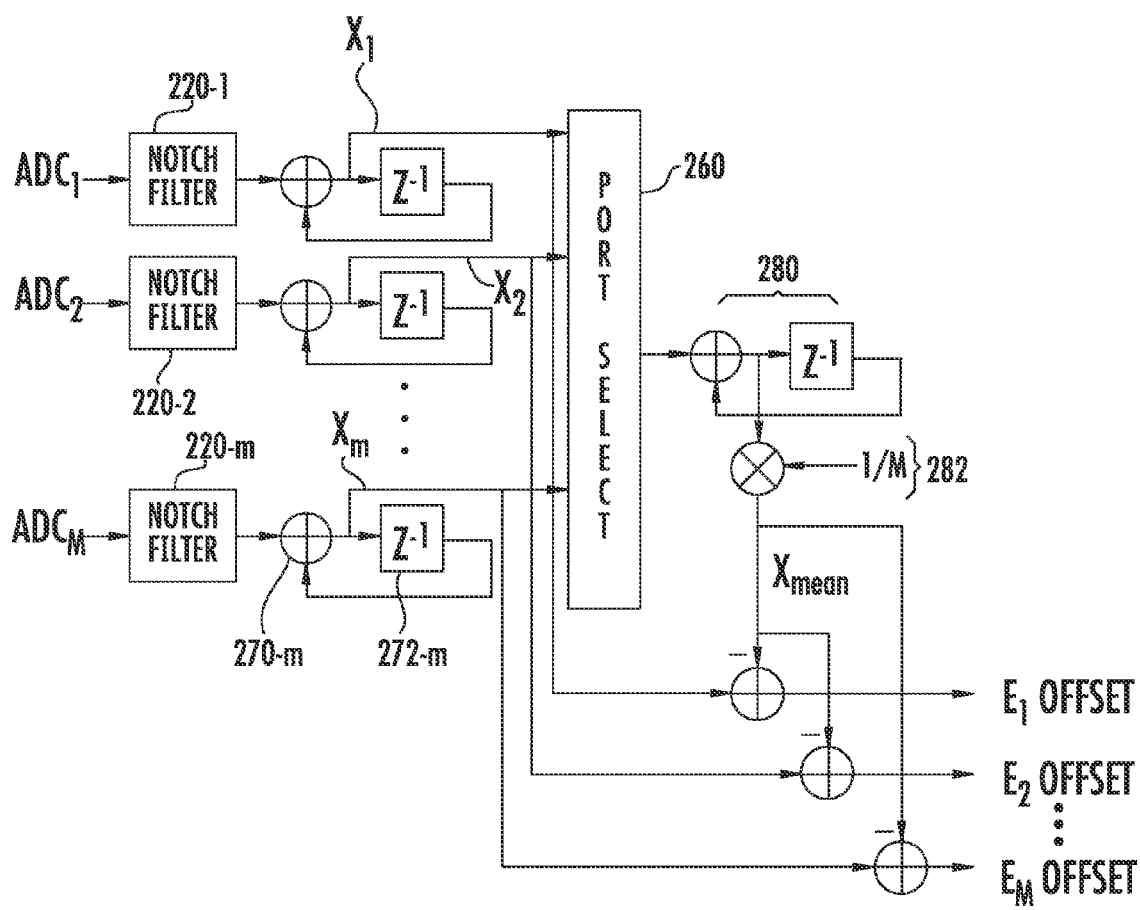
FIG. 4 is a schematic representing offset error calculation.

A schematic that shows how the DSP 240 can perform the calculation of $X_k$ (for $k=1$ to M) and $X_{mean}$ is shown in FIG. 4. The output from each $ADC_k$ is accumulated (with a corresponding summer 270-k and delay 272-k) for $N_o$ samples to provide each $X_k$. The port selector 260 then selects each accumulated ADC output $X_k$ in turn, since the outputs from the accumulators are available in a time-interleaved fashion. The result is then further accumulated (by accumulator 280) and averaged (by multiplier 282), by dividing the accumulated sum by M to provide $X_{mean}$. Next, $X_{mean}$ is subtracted from each $X_k$ to provide $E_k^{offset}$.

Figure 5:
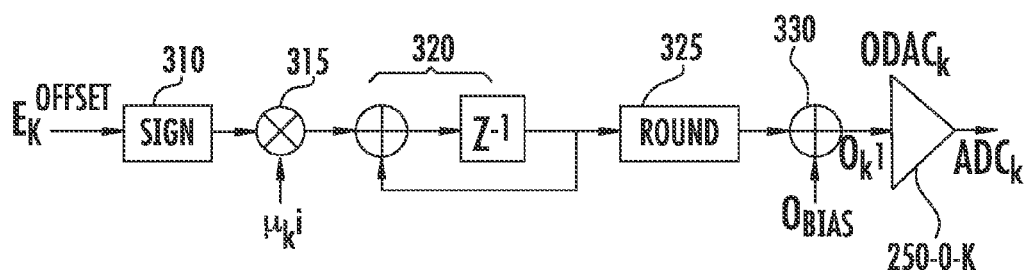
FIG. 5 is a schematic representing the recursive structure for effecting the offset adaptive algorithm.

In FIG. 5, a schematic for an adaptive algorithm for how the DSP 240 can perform offset correction is depicted. The sign 310 of each $E_k^{offset}$ is first multiplied 315 by the adaptation step-size $\mu_k^i$ and then accumulated 320. The accumulated value in each iteration is rounded 325 to the nearest integer value and added 330 to the offset bias, $O_{bias}$, to provide the offset correction value $O_k^i$ to a corresponding one of the DACs, namely $ODAC_k$. The output from $ODAC_k$ directly or indirectly controls the offset setting on $ADC_k$. Such an adaptive process converges to an optimal value that minimizes the offset error in each ADC.

Figure 6:
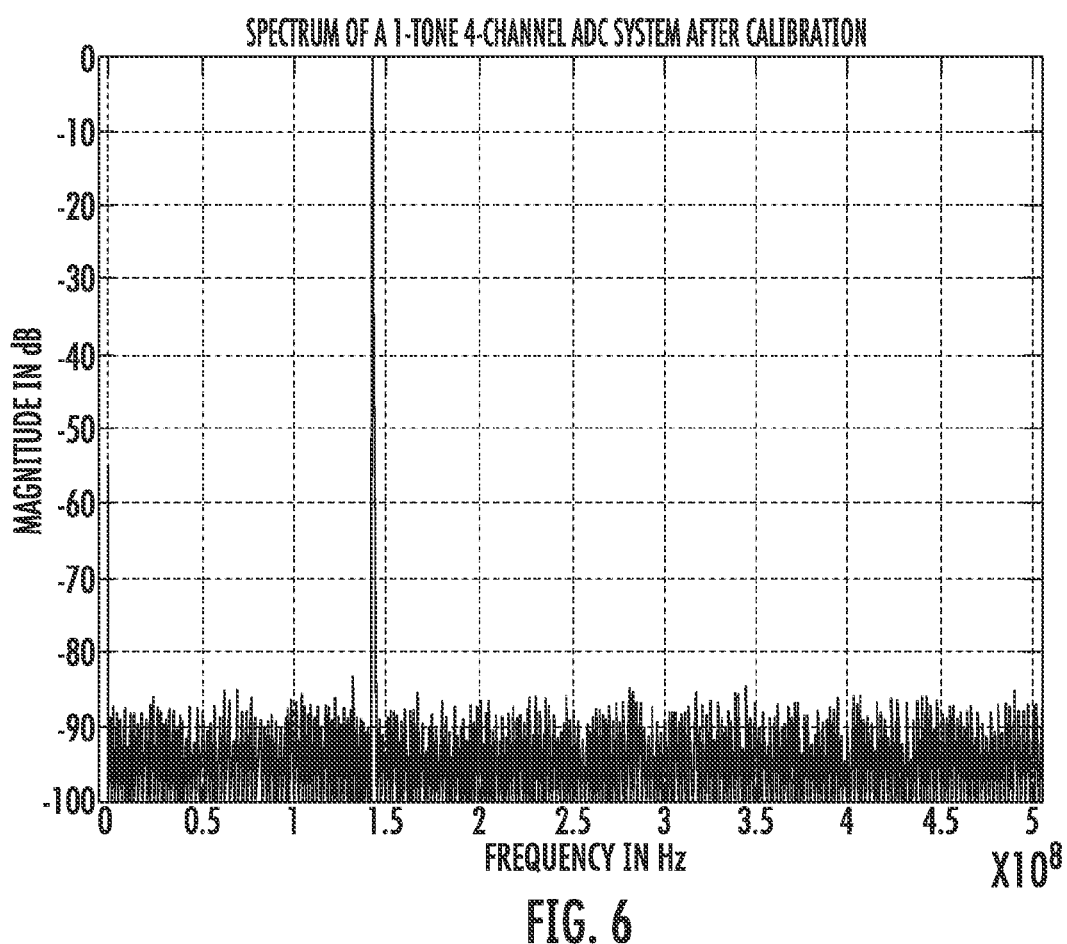
FIG. 6 is a spectrum of a single tone signal with offset mismatch error after correction in a four-channel time-interleaved ADC.

FIG. 6 shows the spectrum of the tone mentioned in FIG. 3 after correction. As can be seen from the figure, the offset spurs at 250 MHz and 500 MHz are reduced.

Gain Correction

Figure 7:
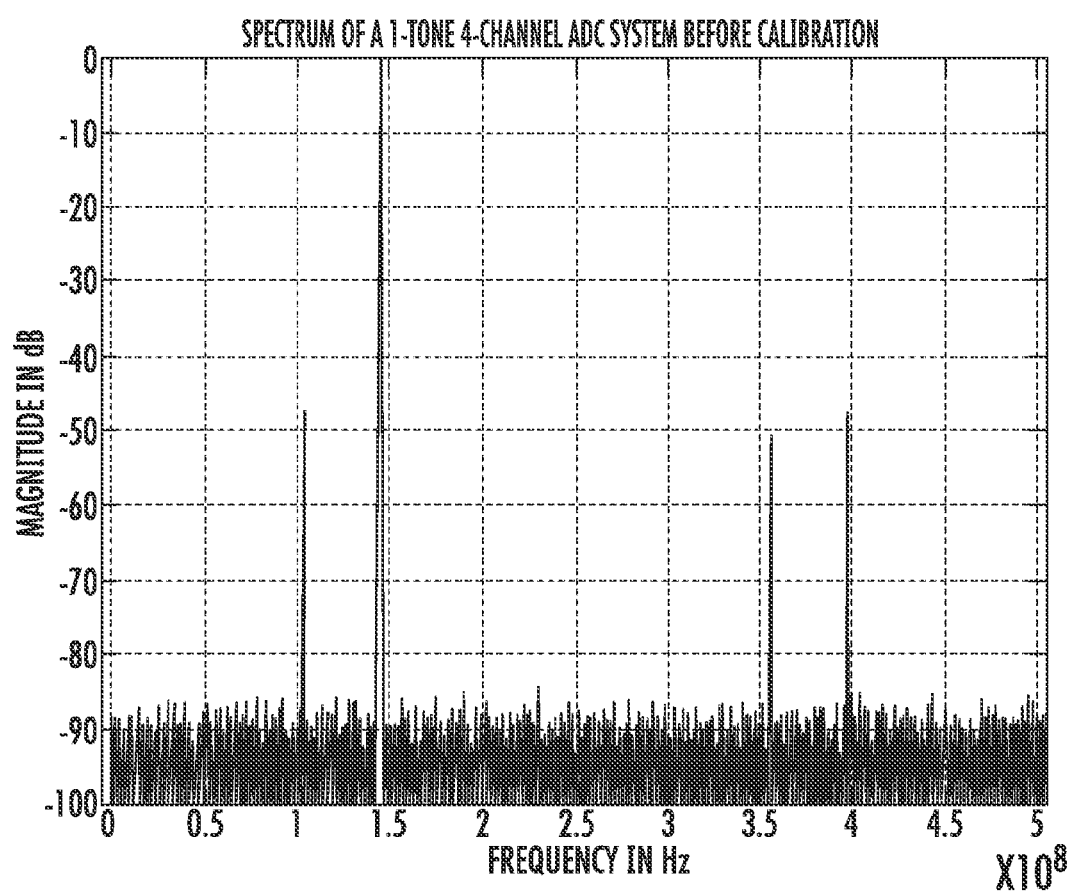
FIG. 7 is a spectrum of a single tone signal with gain mismatch error before correction in a four-channel time-interleaved ADC.

Gain differences in the ADCs produce gain spurs at $\pm F_{in}+kF_S/M$ frequencies, where $F_{in}$ is the set of input frequencies and $k=1, 2, \ldots, M$. FIG. 7 shows the spectrum of a 145 MHz tone in a four-channel time-interleaved ADC (without correction) sampling at 1 GHz where the gain spurs appear at 105 MHz, 355 MHz and 395 MHz. In order to reduce the amplitude of these spurs, the power of the signals from each ADC are determined. Towards this end, define $$Y_k = \frac{1}{N_g} \sum_{n=0}^{N_g-1} x_k^2(n) \tag{7}$$

where $x_k(n)$ represents the samples from $ADC_k$, $N_g$ is the number of samples collected to obtain $Y_k$ and $k=1, 2, \ldots, M$. Let $$Y_{mean} = \frac{1}{M}\sum_{k=1}^{M} Y_k \qquad (8)$$

Now define a gain error for each ADC as $$E_k^{gain} = Y_k - Y_{mean} \qquad (9)$$

for $k=1, 2, \ldots, M$. It can be seen from the above equation that $Y_{mean}$ provides a reference value for the power in each iteration so that an adaptive algorithm can be used to minimize $E_k^{gain}$. Below is outlined an adaptive algorithm to correct the gain error in each ADC based on $E_k^{gain}$, for $k=1, 2, \ldots, M$.

Let $GDAC_k$ be the one of the DACs 250 that provides the gain correction to $ADC_k$. Let $R_G$ be the size of the $GDAC_k$. A step size that controls the convergence of the adaptive algorithm associated with gain correction is denoted by $v_k^i$ for $ADC_k$ at the i th iteration. The value of $v_k^i$ lies in the range $[v_k^{offsetmin}, v_k^{offsetmax}]$. Let $G_k^i$ be the value input to the $GDAC_k$. Again, the values of $G_k^i$ can vary between $[-128, 127]$ or between $[0, 255]$ if $R_G=256$. The constant $G_{bias}$ is a value that allows the correction to be done with respect to a certain value. For the case when $G_{bias} R_G/2=128$, the input to the $GDAC_k$ lies in the range $[0, 255]$. On the other hand, when the range of the $GDAC_k$ input values is in $[-128, 127]$, $G_{bias}=0$. Let $\beta_k^i$ denote a variable that provides correction to the $GDAC_k$ input $G_k^i$ associated with $ADC_k$ at the i th iteration. Now the adaptive algorithm for gain correction can be written as $$G_k^i = G_{bias} + \text{round}(\beta_k^i) \qquad (10)$$

$$\beta_k^{i+1} = \beta_k^i + \text{sign}(E_k^{gain}) v_k^i \qquad (11)$$

$$v_k^{i+1} = \max\left(\frac{v_k^i}{2}, v_k^{gainmin}\right) \text{ for } i = s_k \qquad (12)$$

where $\beta_k^0 = v_k^0 = v_k^{gainmax}$, and $s_k$ is any arbitrary positive number. The convergence can be controlled by $v_k^i$ by changing its value at every $s_k$ th iteration.

Figure 8:
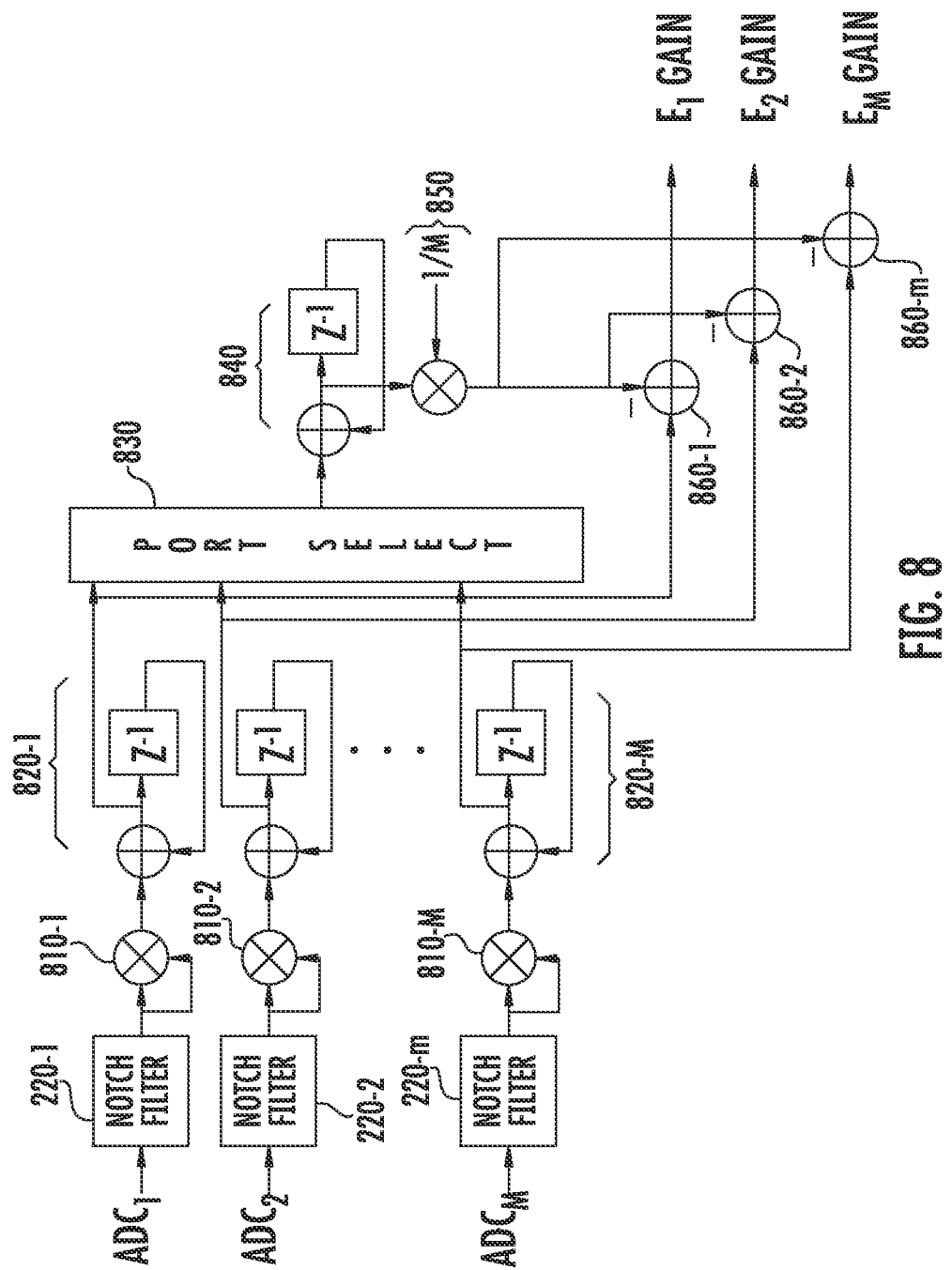
FIG. 8 is a schematic representing gain error calculation.

A schematic that shows how the DSP can perform a calculation of $Y_k$ and $Y_{mean}$ is shown in FIG. 8. The output from each $ADC_k$ is squared 810 and accumulated 820 for $N_g$ samples to provide $Y_k$. The port selector 830 then selects the squared and accumulated output of each ADC in turn and accumulates 840 the result. This is followed by an averaging operation 850 that is effected by dividing the accumulated sum by M to provide $Y_{mean}$. Next, $Y_{mean}$ is subtracted 860 from each $Y_k$ to provide $E_k^{gain}$.

Figure 9:
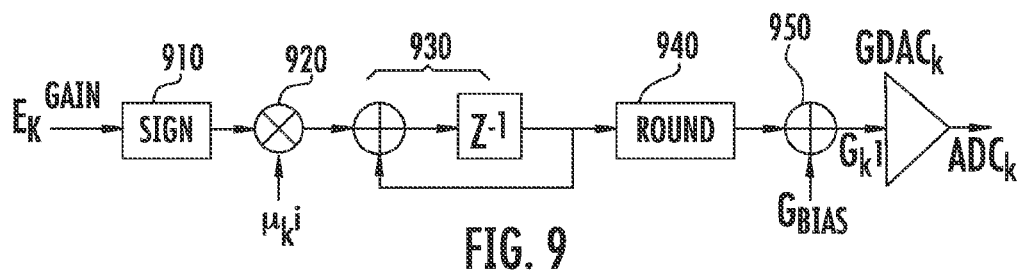
FIG. 9 is a schematic representing the recursive structure for effecting the gain adaptive algorithm.

In FIG. 9, a schematic for an adaptive algorithm for the DSP 240 to perform gain correction is shown. The sign 910 of each $E_k^{gain}$ is multiplied 920 by the adaptation step-size and accumulated 930. The accumulated value in each iteration is rounded 940 to the nearest integer value and added 950 to the gain bias, $G_{bias}$, to provide the gain correction value to $GDAC_k$. The output from $GDAC_k$ directly or indirectly controls the gain setting on $GADC_k$.

Figure 10:
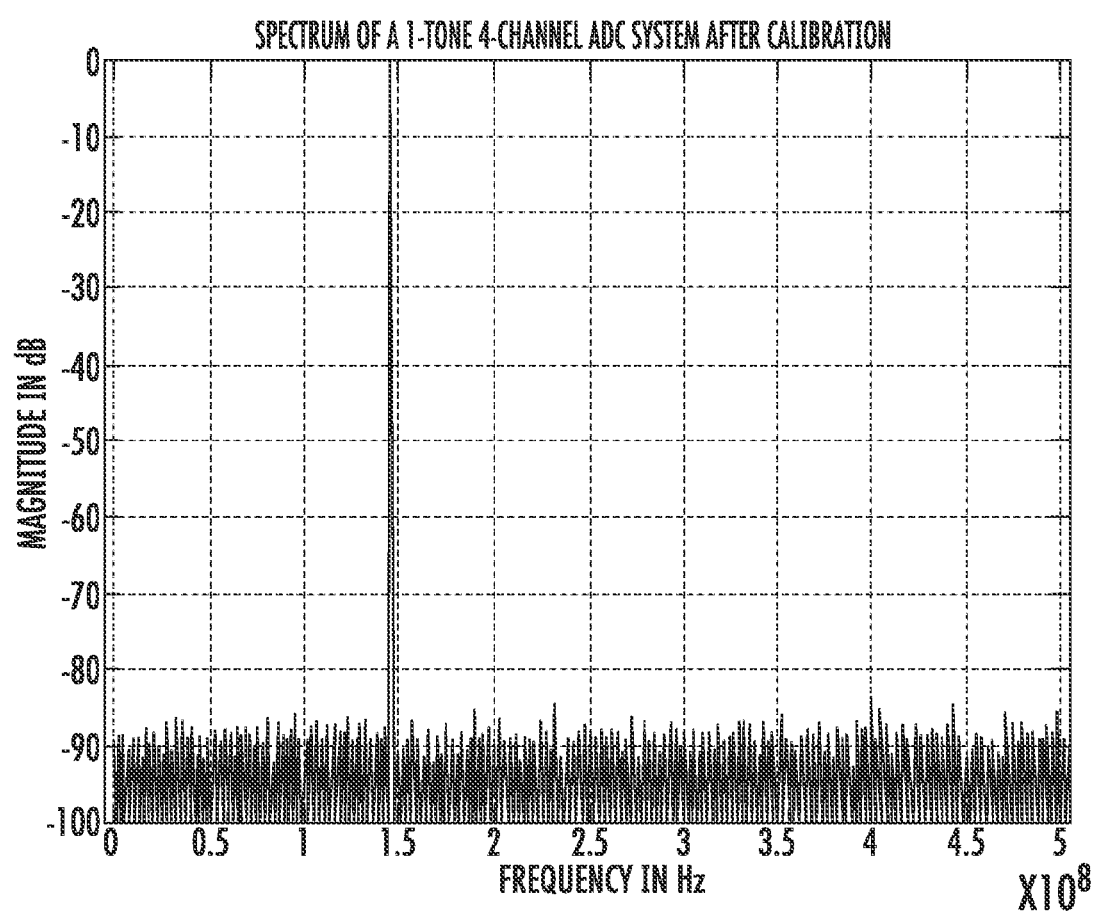
FIG. 10 is a spectrum of a single tone signal with gain mismatch error after correction in a four-channel time-interleaved ADC.

The above adaptive process converges to an optimal value that minimizes the gain error in each ADC. FIG. 10 shows the spectrum of the tone mentioned in FIG. 7 after gain mismatch correction. As can be seen, the gain spurs at 105 MHz, 355 MHz and 395 MHz have been reduced.

Phase Correction

Figure 11:
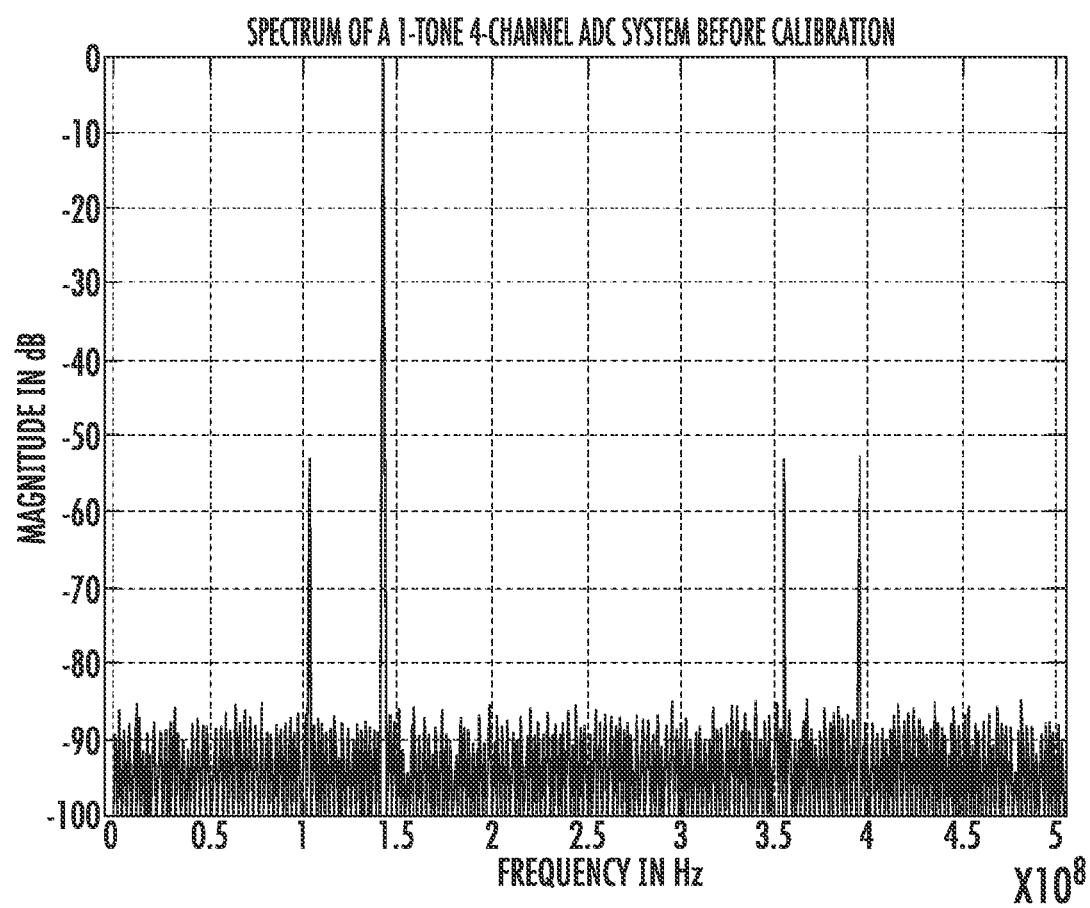
FIG. 11 is a spectrum of a single tone signal with phase mismatch error before correction in a four-channel time-interleaved ADC.

Since all the ADCs 210 do not have uniform sample instants in reference to the sampling frequency of the MCTIADC 200, timing or phase spurs show up at the same frequencies as those due to gain errors. One difference however is that gain spurs are orthogonal to the phase spurs. FIG. 11 shows the spectrum of a 145 MHz tone in an uncorrected four-channel time-interleaved ADC sampling at 1 GHz with phase spurs. As can be seen, the phase spurs occur at the same frequencies as those shown in FIG. 7. In order to minimize the amplitude of these spurs, a cross-correlation between any two adjacent ADCs must be determined. In view of this, define $$Z_k = \frac{1}{N_p}\sum_{n=1}^{N_p}(x_k(n-1) - x_{k+1}(n-1))^2 \qquad (13)$$

$$\text{for } k = 1, 2, \ldots, M-1$$

$$= \frac{1}{N_p}\sum_{n=1}^{N_p}(x_M(n-1) - x_1(n))^2$$

$$\text{for } k = M$$

where $x_k(n)$ represents the samples from $ADC_k$, $N_p$, is the number of samples collected to obtain the average $Z_k$ and $k=1, 2, \ldots, M$. Let $$Z_{mean} = \frac{1}{M}\sum_{k=1}^{M} Z_k \qquad (14)$$

Now define a phase error for $ADC_k$ as $$E_k^{phase} = Z_k - Z_{mean} \qquad (15)$$

for $k=1, 2, \ldots, M$. In a manner similar to offset and gain error estimation, $Z_{mean}$ provides a reference value for timing in each iteration so that an adaptive algorithm can be used to minimize $E_k^{phase}$. It is now possible to provide an adaptive algorithm to correct the phase error in each ADC based on $E_k^{phase}$, for $k=1, 2, \ldots, M$.

Let $PDAC_k$ be the DAC 250 that provides the timing or phase correction to $ADC_k$. Let $R_P$ be the size of the $PDAC_k$. A step size that controls the convergence of the adaptive algorithm associated with phase correction is denoted by $\xi_k^i$ for $ADC_k$ at the i th iteration. The value of $\xi_k^i$ is constrained to be in the range $[\xi_k^{phasemin}, \xi_k^{phasemax}]$. Let $P_k^i$ be the value input to the $PDAC_k$. Similar to the bias values in the offset and gain adaptive algorithms, the constant $P_{bias}$ is a value that allows the correction to be done with respect to a certain value. Let $\gamma_k^i$ denote a variable that provides correction to the $PDAC_k$ input $P_k^i$ associated with $ADC_k$ at the i th iteration. It is possible to now write the adaptive algorithm for phase correction as $$P_k^i = P_{bias} + \text{round}(\gamma_k^i)$$

$$\gamma_k^{i+1} = \gamma_k^i + \text{sign}(E_k^{gain})\xi_k^i$$

$$\xi_k^{i+1} = \max\left(\frac{\xi_k^i}{2}, \xi_k^{gainmin}\right) \text{ for } i = t_k$$

where $\gamma_k^0=0$, $\xi_k^0=\xi_k^{gainmax}$, and $t_k$ is any arbitrary positive number. The convergence of the adaptive algorithm is controlled by $\xi_k^i$ by changing its value at every $s_k$ th iteration.

Figure 12:
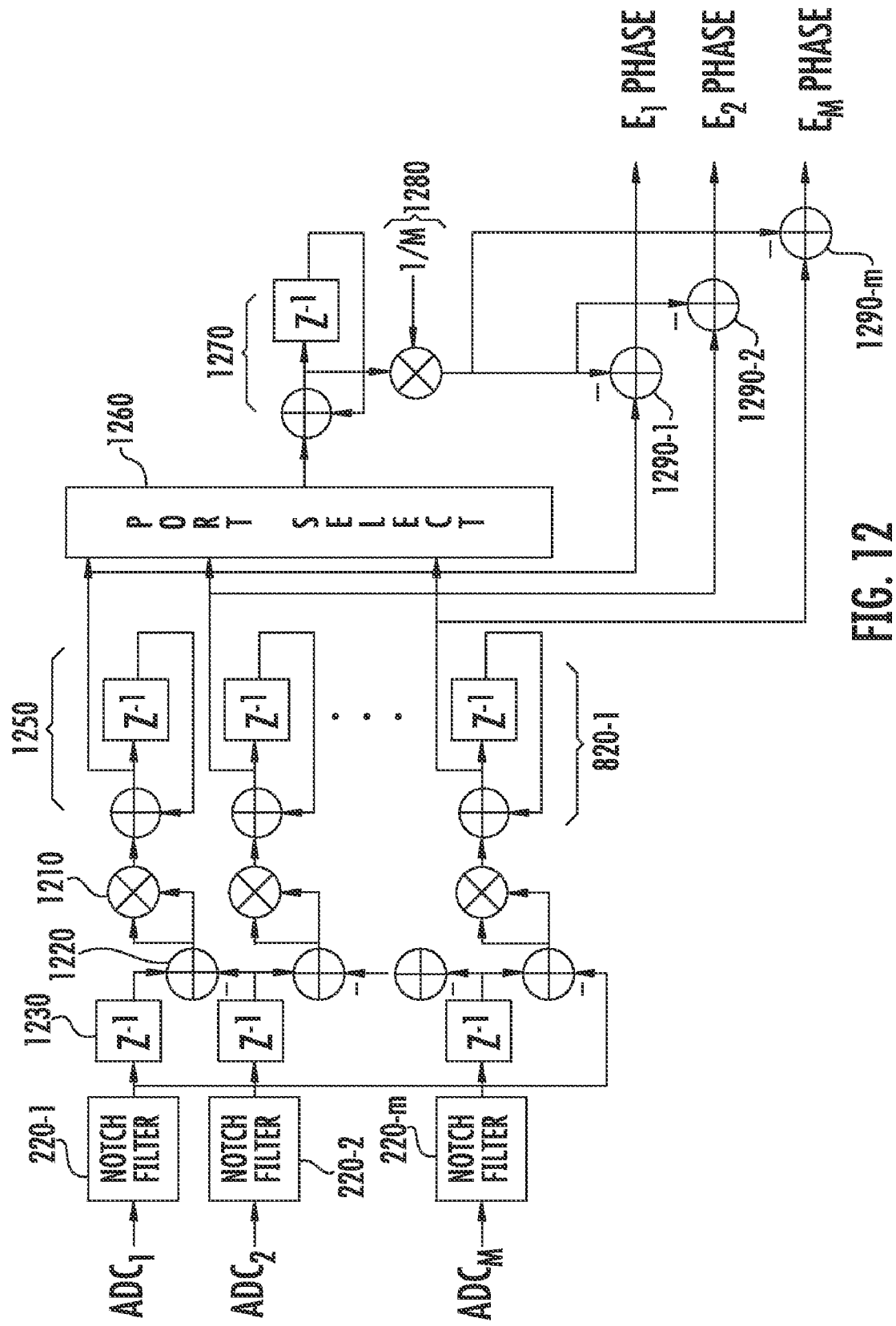
FIG. 12 is a schematic representing phase error calculation.

A schematic that shows the calculation of $Z_k$ and $Z_{mean}$ by DSP 250 is shown in FIG. 12. For all $ADC_k$, where k=1, 2, ..., M–1, the squared 1210 difference 1220 of the delayed 1230 outputs from any two adjacent ADCs is accumulated for $N_p$ samples to provide the corresponding $X_k$. For $ADC_M$, the present sample on $ADC_1$ is subtracted from the delayed input from $ADC_M$ and squared. This value is then accumulated 1250 to obtain $X_M$. The port selector 1260 then selects each ADC in turn and accumulates 1270 the result and performs an averaging operation by dividing 1280 the accumulated sum by M to provide $Z_{mean}$. Next, $Z_{mean}$ is subtracted 1290 from each $Z_k$ to provide $E_k^{phase}$.

Figure 13:
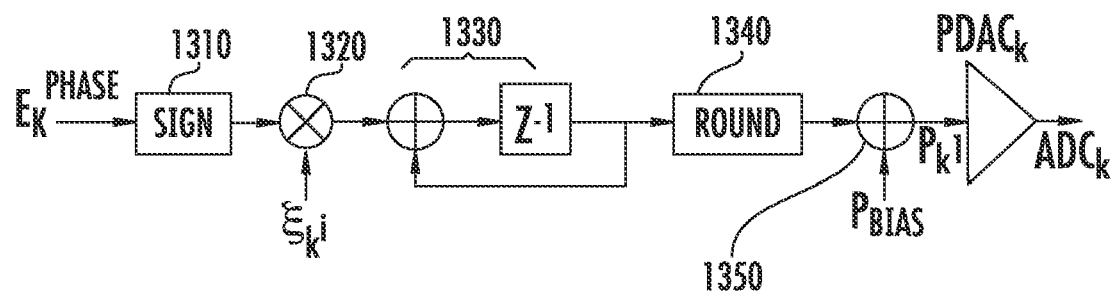
FIG. 13 is a schematic representing the recursive structure for effecting the phase adaptive algorithm.

In FIG. 13, a schematic for adaptive algorithm performing phase correction is shown. The sign 1310 of each $E_k^{phase}$ is multiplied 1320 by the adaptation step-size $\xi_i^k$ and accumulated 1330. The accumulated value in each iteration is rounded 1340 to the nearest integer value and added 1350 to the phase bias, $P_{bias}$, to provide the phase correction value to $PDAC_k$. The output from $PDAC_k$ directly or indirectly controls the phase setting on $ADC_k$.

Figure 14:
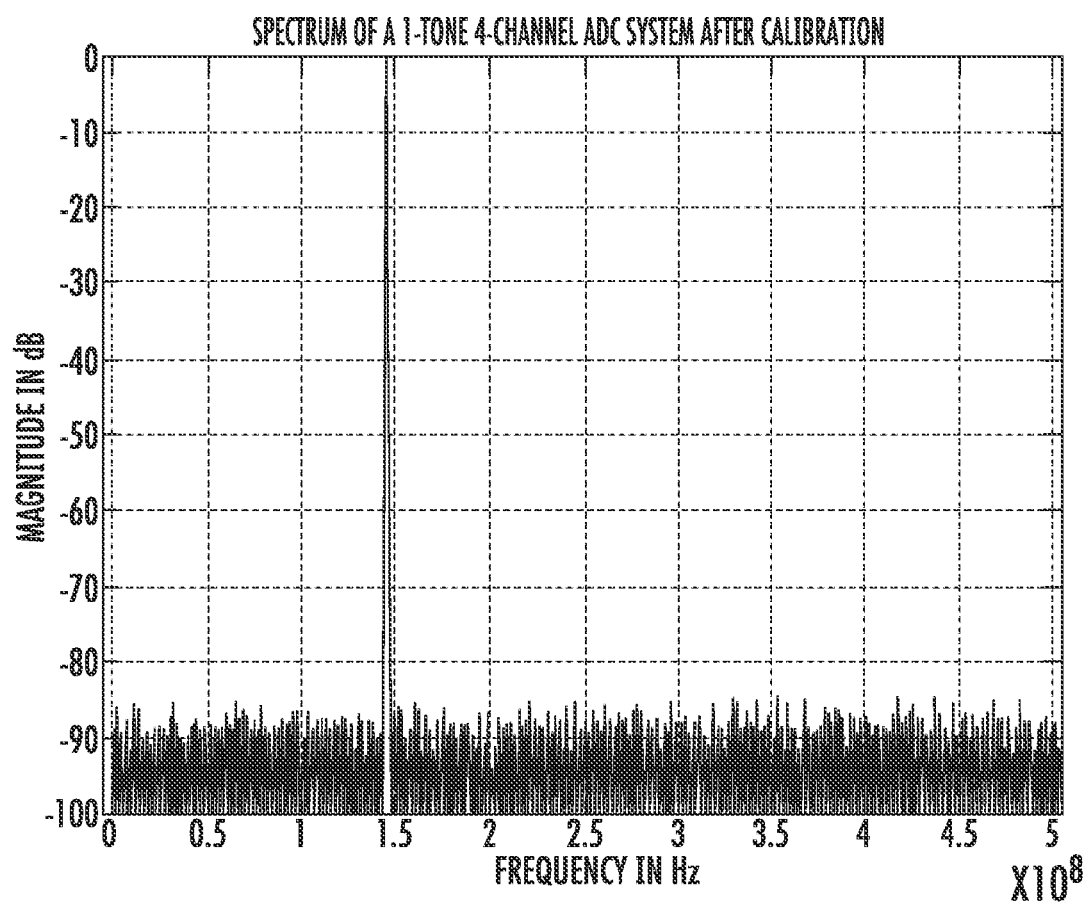
FIG. 14 is a spectrum of a single tone signal with phase mismatch error after correction in a four-channel time-interleaved ADC.

The adaptive algorithm for phase correction converges in a manner that minimizes the magnitude of $E_k^{phase}$. FIG. 14 shows the spectrum of the tone mentioned in FIG. 3 after phase correction. As can be seen from the figure, the phase spurs at 105 MHz, 355 MHz and 395 MHz have been reduced.

Figure 15:
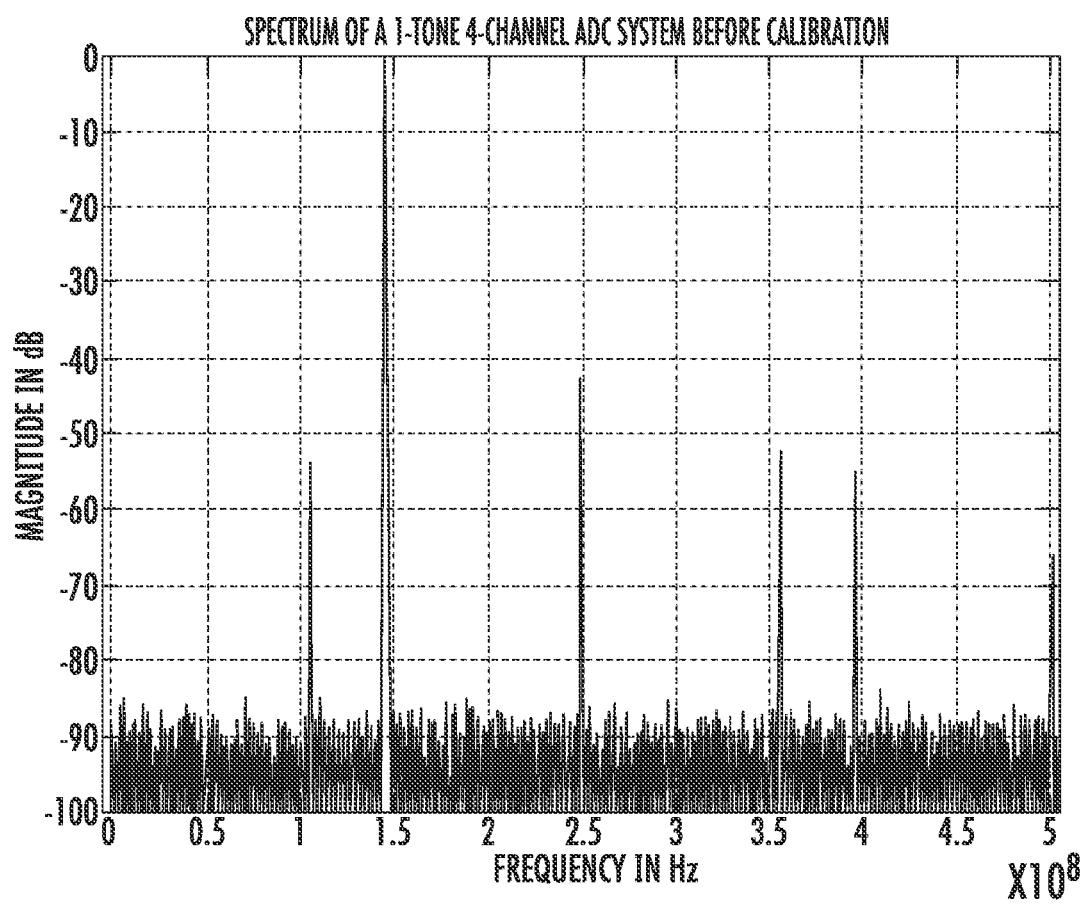
FIG. 15 is a spectrum of a single tone signal with offset, gain and phase mismatch errors before correction in a four-channel time-interleaved ADC.
Figure 16:
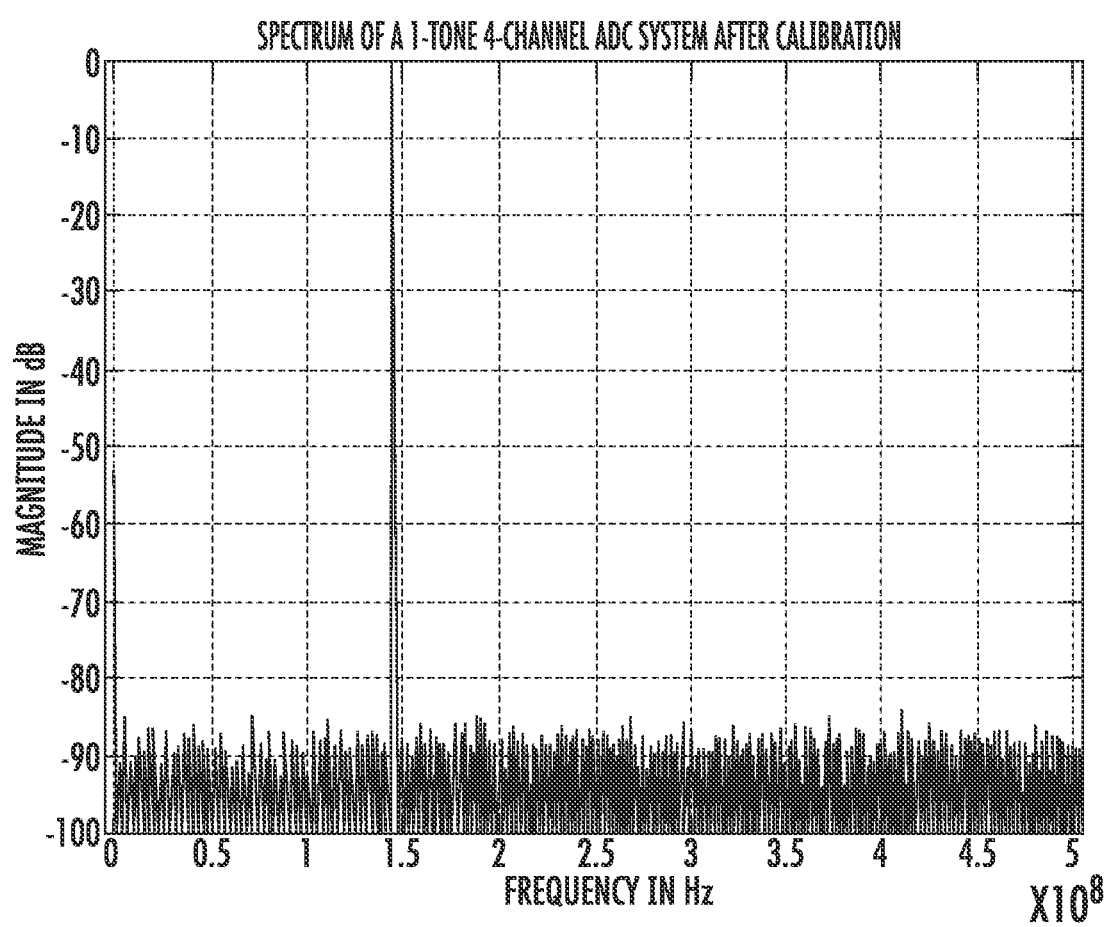
FIG. 16 is a spectrum of a single tone signal with offset, gain and phase mismatch errors after correction in a four-channel time-interleaved ADC.

So far what has been described are the adaptive algorithms pertaining to specific mismatch errors. In the presence of all the mismatches, viz., offset, gain and phase mismatches, the adaptive algorithms are run on a round-robin basis, starting with offset, gain and then phase. FIG. 15 shows the spectrum of a tone with all the mismatch errors while FIG. 16 shows the spectrum after mismatch errors have been reduced. As can be seen from the figure, the offset spurs at 250 MHz and 500 MHz, as well as gain and phase spurs at 105 MHz, 355 MHz and 395 MHz have been reduced.

Figure 17:
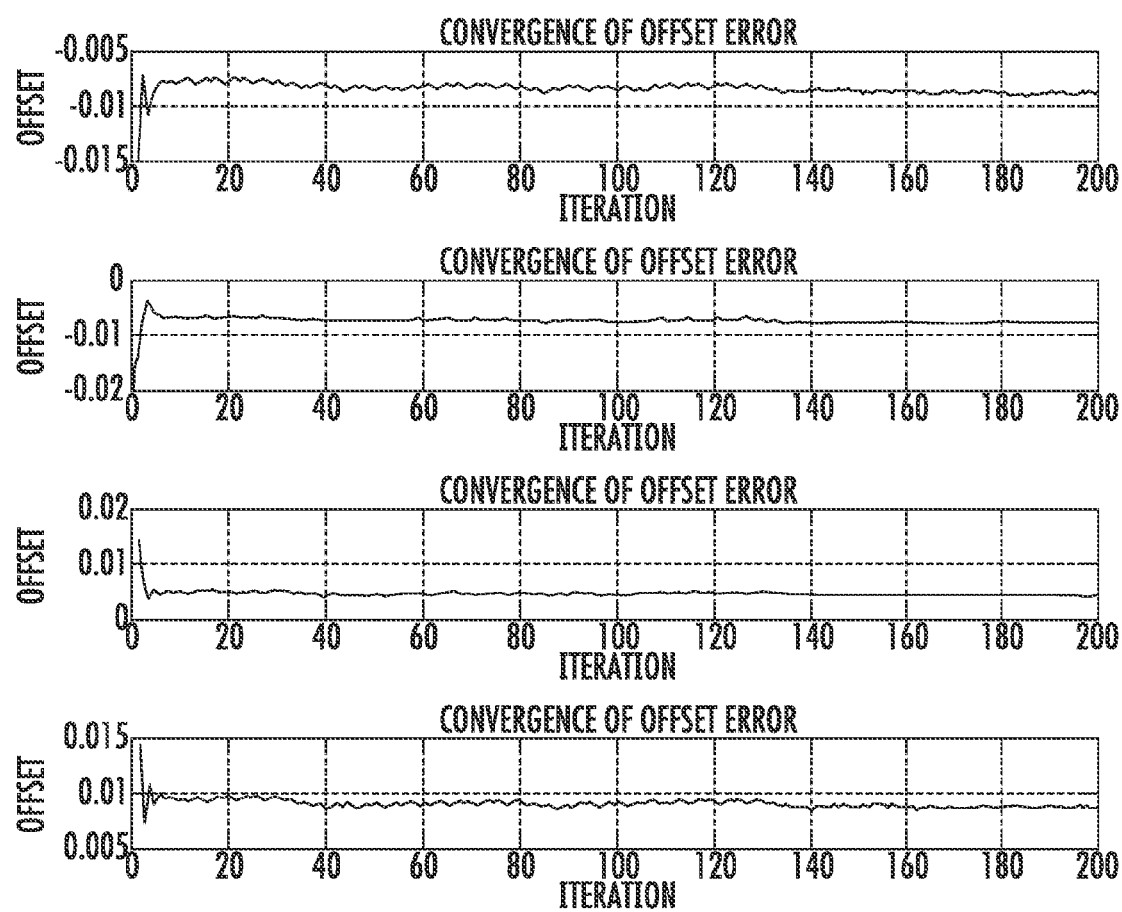
FIG. 17 illustrates convergence of offset mismatch error in a four-channel time-interleaved ADC.
Figure 18:
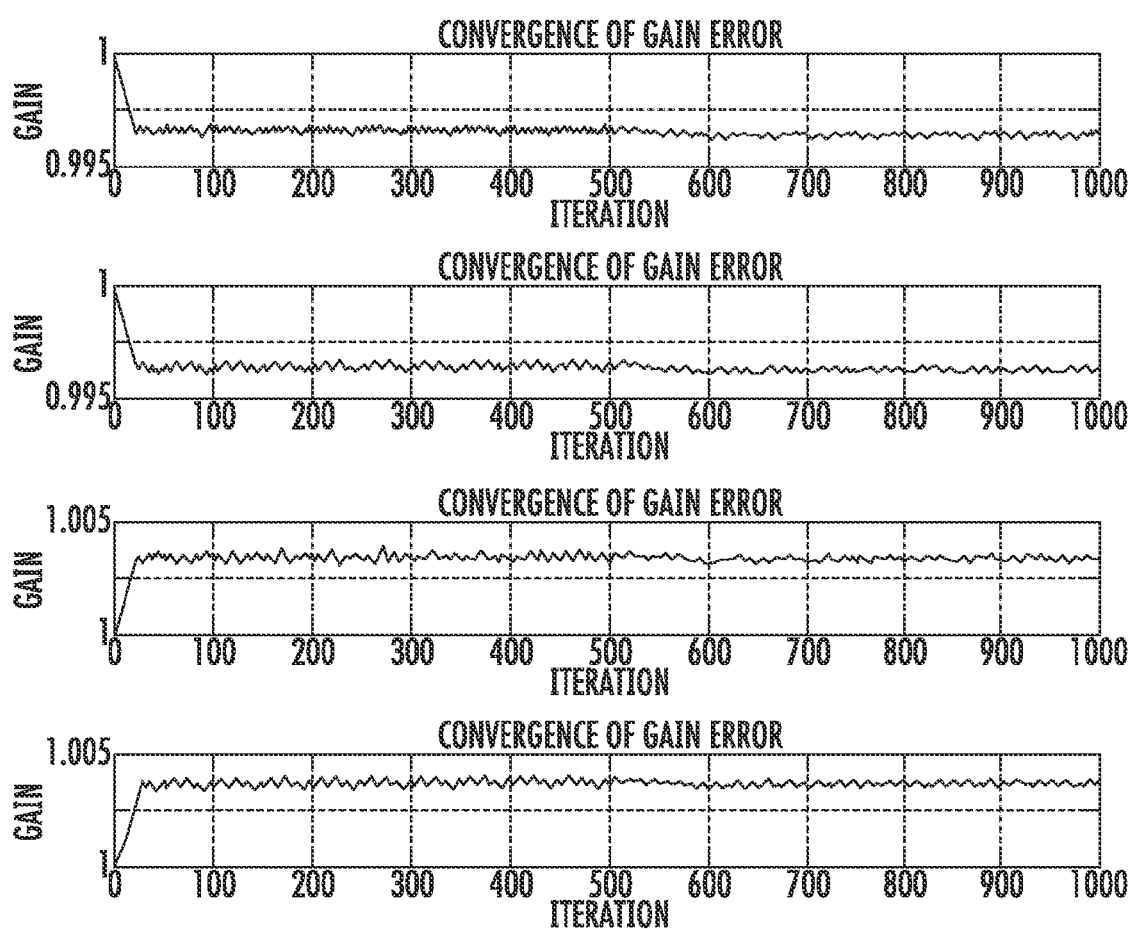
FIG. 18 illustrates convergence of gain mismatch error in a four-channel time-interleaved ADC.
Figure 19:
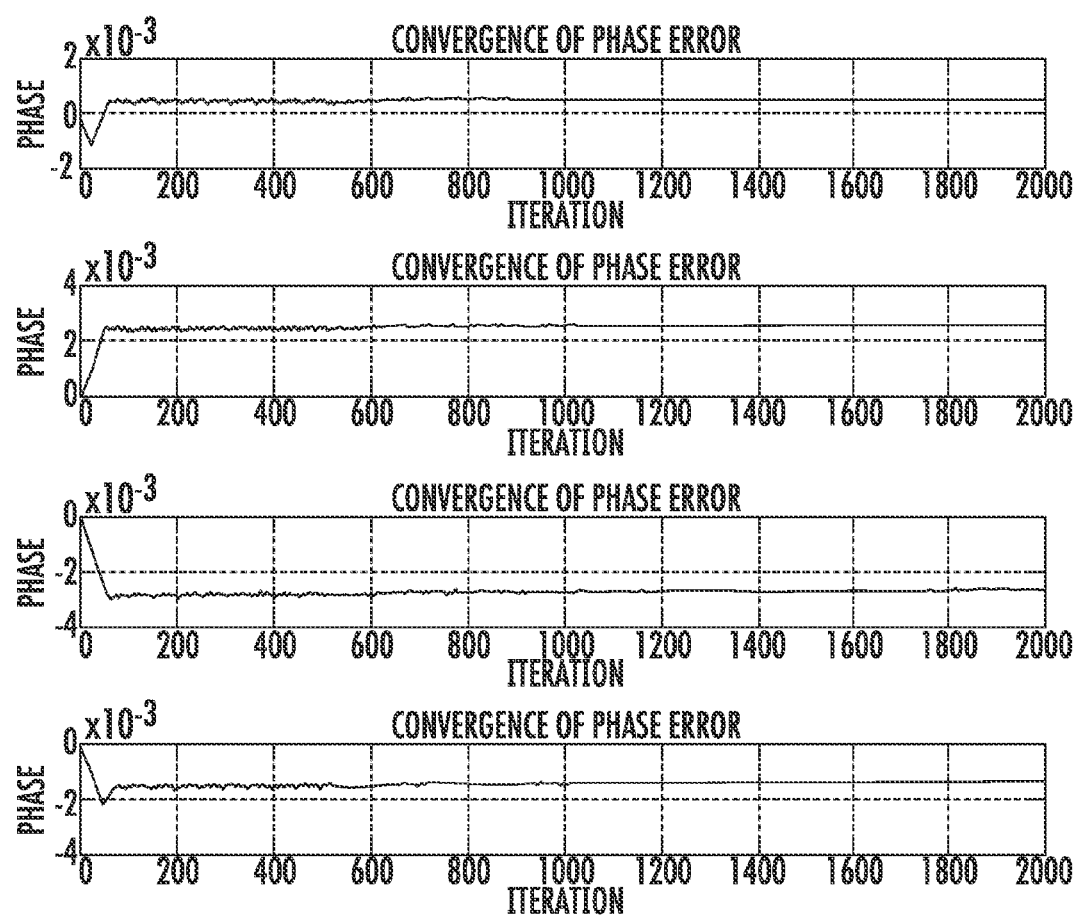
FIG. 19 illustrates convergence of phase mismatch error in a four-channel time-interleaved ADC.

FIGS. 17, 18, and 19 show the convergence of offset, gain and phase errors using the respective adaptive algorithms. It should be understood that the corrections can be made simulatenously, with one or more DSPs or hardware circuits, or by sharing a single DSP or a single hardware circuit in a round-robin fashion. What is important is that the expected rate of change in gain, offset and phase be slower than the rate at which the adaptive algorithms are performed.

Figure 20:
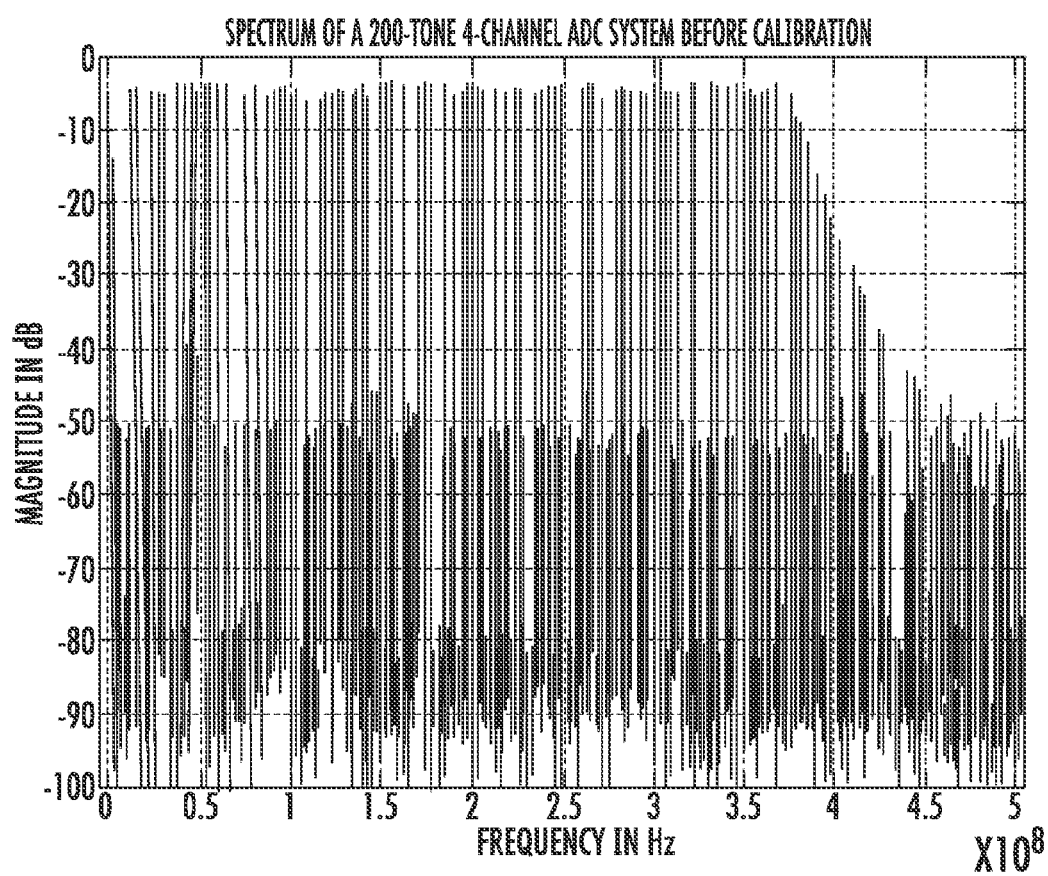
FIG. 20 illustrates a spectrum of a multi-tone signal with offset, gain and phase mismatch errors before correction in a four-channel time-interleaved ADC.
Figure 21:
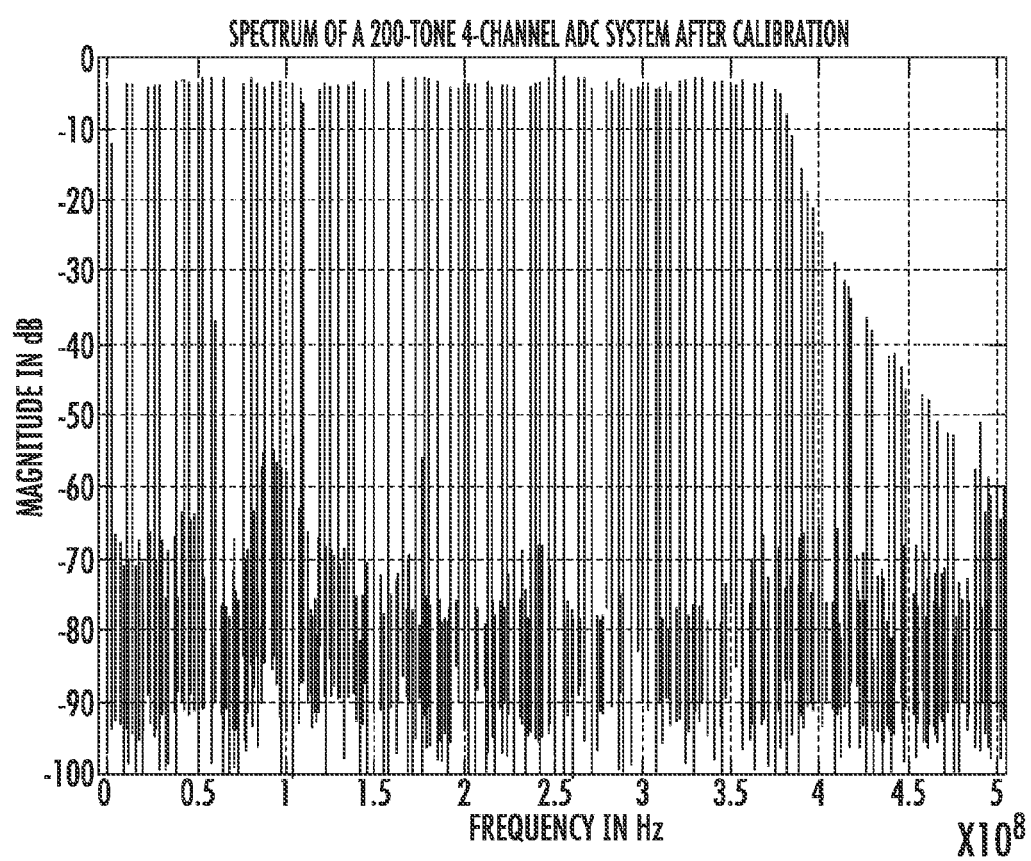
FIG. 21 illustrates a spectrum of a multi-tone signal with offset, gain and phase mismatch errors after correction in a four-channel time-interleaved ADC.
Figure 22:
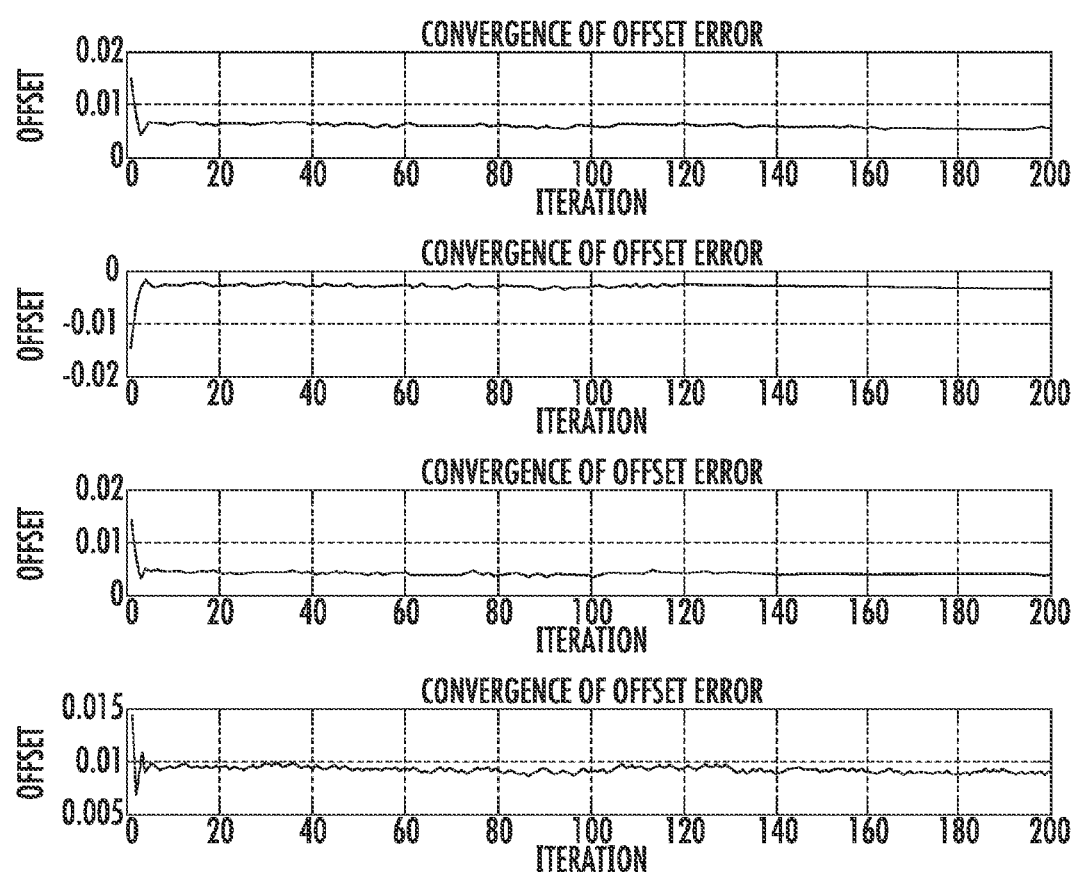
FIG. 22 illustrates convergence of offset mismatch error in a four-channel time-interleaved ADC with a 100-tone signal.
Figure 23:
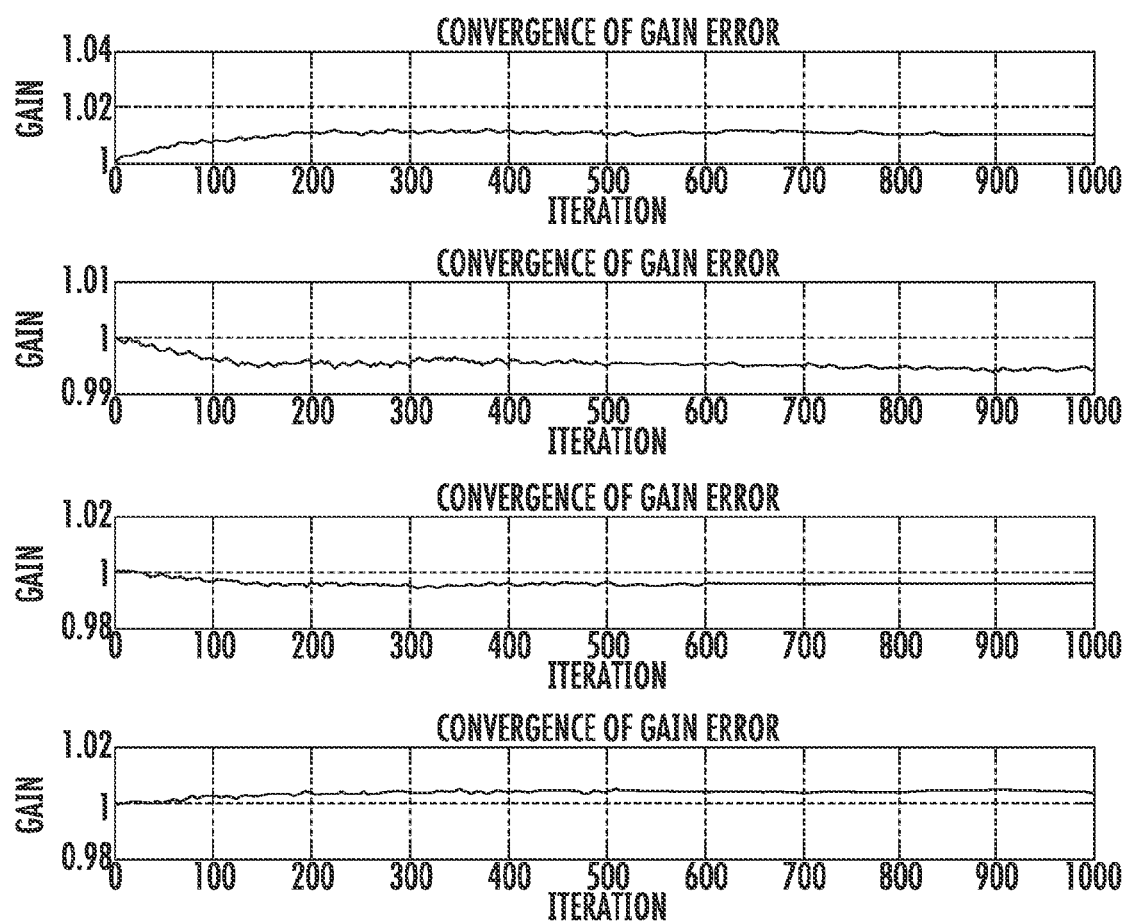
FIG. 23 illustrates convergence of gain mismatch error in a four-channel time-interleaved ADC with a 100-tone signal.
Figure 24:
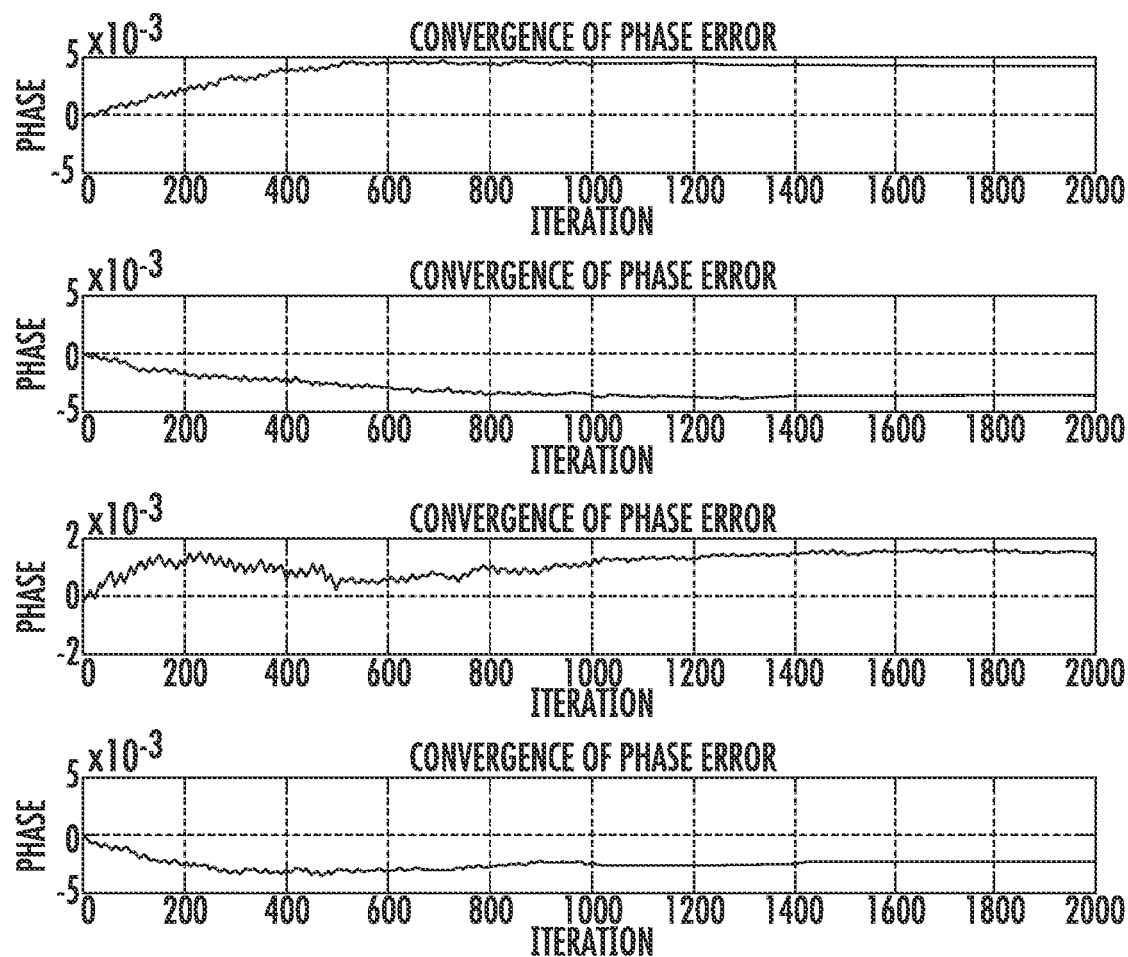
FIG. 24 illustrates convergence of phase mismatch error in a four-channel time-interleaved ADC with a 100-tone signal.

The adaptive algorithms described thus far have shown to work for the case when the input is a single tone. It will be shown that the same set of algorithms will work for the case when the input signal is a wide-band signal. The difference between the two scenarios is the convergence time. The error functions tend to become non-linear and consequently the step size in the adaptive algorithms described would need to be much smaller than when the input signal is a single tone. FIG. 20 shows the spectrum of a wide-band signal comprised of many sinusoids in presence of offset, gain and phase mismatch errors while FIG. 21 shows the spectrum of the same signal after the spurs due to the mismatch errors have been reduced. FIGS. 22, 23, and 24 show the convergence of offset, gain and phase errors using the adaptive algorithms described above.

Notch Filter and its Usefulness

It was mentioned earlier that the spur frequencies for gain and phase appear at $\pm F_{in}+kF_s/M$. If one of the signal components of $F_{in}$ is equal to $$\frac{kF_s}{2M},$$

then it is impossible to distinguish between this tone and the spurs due to gain and phase mismatches. Call such a frequency the gain-phase problem frequency (GPPF). As a consequence GPPF, the algorithms for phase and gain correction tend to diverge. In order to circumvent the divergence of these algorithms in the cases where the input spectrum has a GPPF, a notch filter is introduced at the output of the ADC that will notch out this frequency. The output from each notch filter can then used to evaluate offset, gain and phase errors in a way described above.

In order to develop the design of a notch filter to address this problem, first consider M=2. In this case, the GPPF is at Fs/4. Without any loss of generality, consider the design of a second-order notch filter that performs the notch filtering at these frequencies. A digital notch filter can be realized as $$G(z) = \frac{1}{2}(1 + A(z)) \quad (19)$$

where A(z) is an all-pass filter. The characteristics of G(z) are such that)

$$G(e^{j0})=G(e^{j\pi})=1$$

$$G(e^{j\omega_0})=0 \quad (20)$$

where $\omega_0$ is the angular notch frequency. A second-order transfer function to effect the all-pass filter is given by $$A(z) = \frac{k_2 + k_1(1+k_2)z^{-1} + z^{-2}}{1 + k_1(1+k_2)z^{-1} + k_2 z^{-2}} \quad (21)$$

where $k_1$ and $k_2$ are multipliers defining the notch parameters. It can be shown that this choice of all-pass filter allows the independent tuning of $\omega_0$ and the 3-dB bandwidth according to $$k_1 = -\cos(\omega_0) \quad (22)$$

$$k_2 = \frac{1 - \tan(\Omega/2)}{1 + \tan(\Omega/2)} \quad (23)$$

where $\Omega$ is the 3-dB bandwidth. Using Eqns. 19 and 21, one gets $$G(z) = \frac{1}{2}\left(1 + \frac{k_2 + k_1(1+k_2)z^{-1} + z^{-2}}{1 + k_1(1+k_2)z^{-1} + k_2 z^{-2}}\right) \quad (24)$$

$$= \frac{1+k_2}{2} \frac{1 + 2k_1 z^{-1} + z^{-2}}{1 + k_1(1+k_2)z^{-1} + k_2 z^{-2}}$$

$$= K \frac{1 + 2k_1 z^{-1} + z^{-2}}{1 + k_1(1+k_2)z^{-1} + k_2 z^{-2}}$$

where $K=(1+k_2)/2$ is a scaling factor based on the value of $k_2$. First consider the case of a notch frequency at Fs/4, i.e. $\omega_0=\pi/2$. It can be seen from Eqn. 22, that multiplier $k_1=0$.

Having eliminated the need for a multiplier, Eqn. 24 can be written as $$G(z) = K \frac{1+z^{-2}}{1+k_2 z^{-2}} \quad (25)$$
$$= H(z^2)$$

where $$H(z) = K \frac{1+z^{-1}}{1+k_2 z^{-1}} \quad (26)$$

From Eqn. 26, the impulse response can be written as $$h(n) = \frac{K}{k_2}\delta(n) + \frac{K(k_2-1)}{k_2}(-k_2)^n u(n) \quad (27)$$

Now write Eqn. 23 in terms of Ω. After some manipulation, one gets $$\Omega = 2\tan^{-1}\left(\frac{1-k_2}{1+k_2}\right) \quad (28)$$

Figure 25:
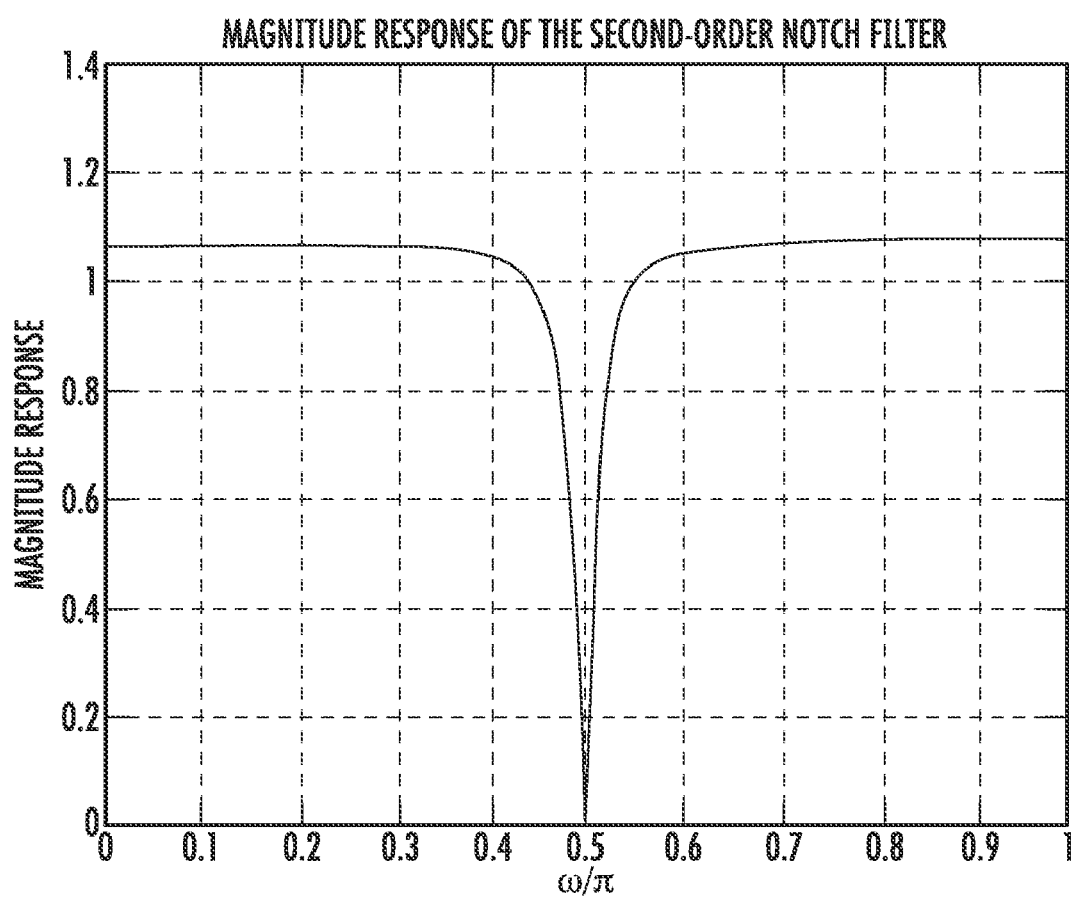
FIG. 25 illustrates a magnitude response of the second-order notch filter.

As can be seen from the above equation, the bandwidth depends on the value of $k_2$. Thus by appropriately choosing the value of $k_2$ as a Canonic Signed Digit (CSD) number, the need for a multiplication can be circumvented. For example, by choosing $k_2=1-2^{-3}=0.875$, one can obtain a bandwidth of $\Omega=0.0424\pi$. It must be noted that as $k_2$ approaches unity, K approaches unity. Hence, in many applications, the scale factor K can also be eliminated. Using K=1, the frequency response of a notch filter G(z) with the above value of $k_2$ is shown in FIG. 25 for $\omega_0=\pi/2$.

Figure 26A:
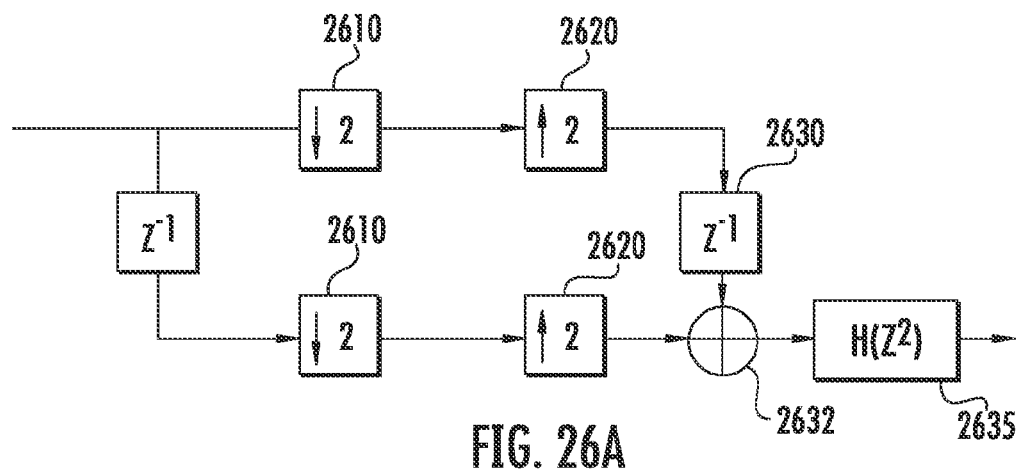
FIGS. 26(a), 26(b) and 26(c) illustrate a multi-rate structure of a two-channel ADC with the notch filter.
Figure 26B:
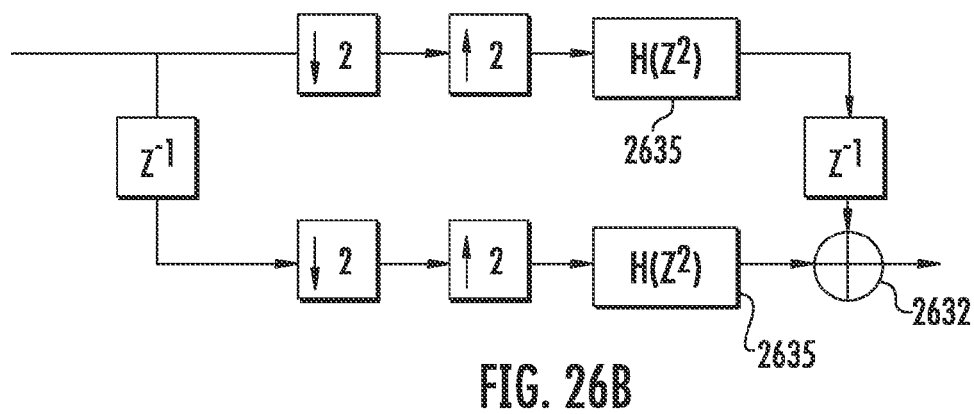
Figure 26C:
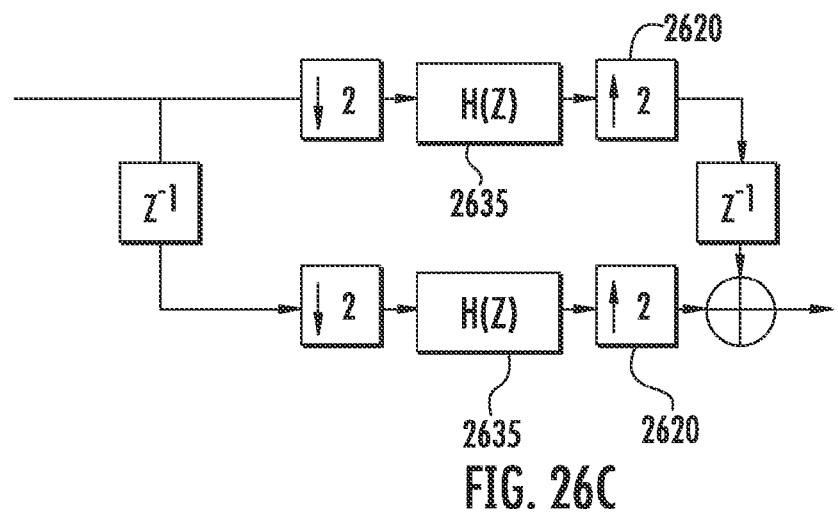

For M=2, consider the two-channel interleaved ADC in conjunction with the notch filter characterized by $H(z^2)$ from a multi-rate signal processing point of view. FIG. 26(*a*) shows such a structure where equivalent output from each ADC is the output from a 2× decimator 2610. The commutator action is represented by the 2× interpolators 2620, the delay element 2630 and the adder 2632. The signals at the output of the adder 2632 and the notch filter 2635 operate at $F_S$. By shifting the filter 2635 before the adder 2632, one gets the structure shown in FIG. 26(*b*). Finally, by using a property called Nobel Identity in multi-rate signal processing, one can move the filter 2635, given by H(z), before the interpolators 2620. Hence, starting with a second-order notch filter with a notch at $\omega_0=\pi/2$, in FIG. 26(*c*) it has now been converted to a single pole filter running at Fs/2 rate. It is interesting to note that H(z) now has a notch at the Nyquist frequency of each ADC.

Now consider the case of M=4. The GPPF are at Fs/8 and $3F_S/8$. In terms of normalized frequency these frequencies are $\pi/4$ and $3\pi/4$. Consider an 2× upsampled version of G(z) given by Eqn. 25. One gets $$G(z^2) = K \frac{1+z^{-4}}{1+k_2 z^{-4}} \quad (29)$$
$$= H(z^4)$$

Figure 27:
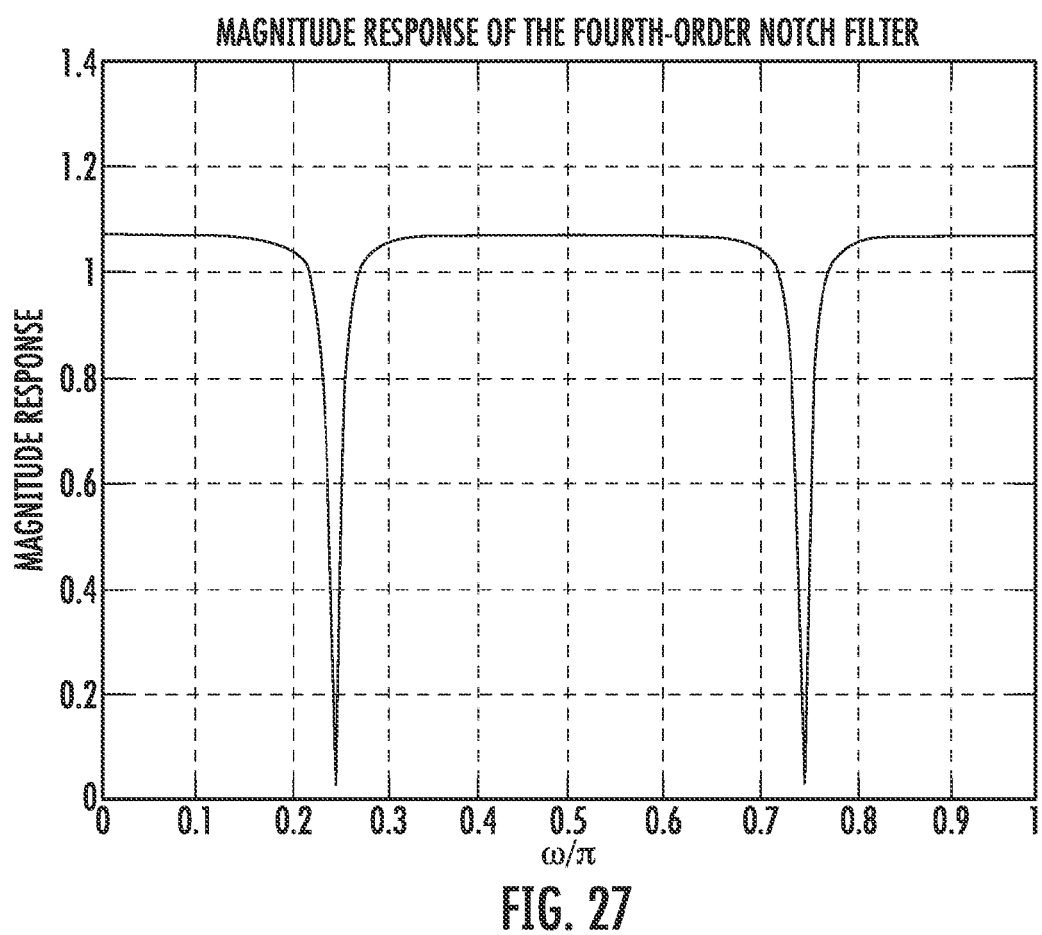
FIG. 27 illustrates a magnitude response of the fourth-order notch filter.
Figure 28A:
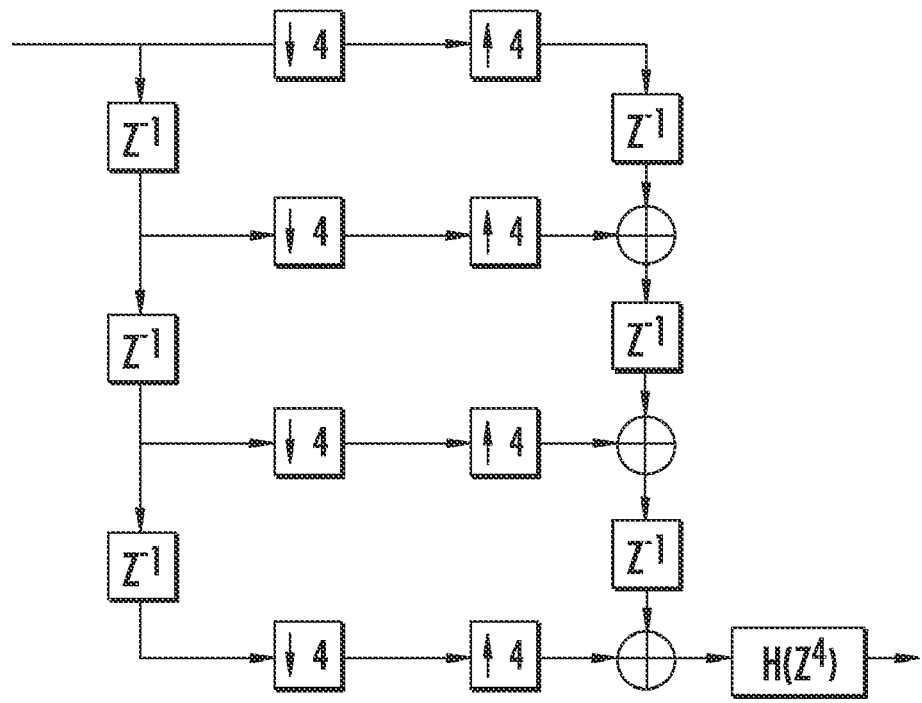
FIGS. 28(a) and 28(b) illustrate a multi-rate structure of a four-channel ADC with the notch filter.
Figure 28B:
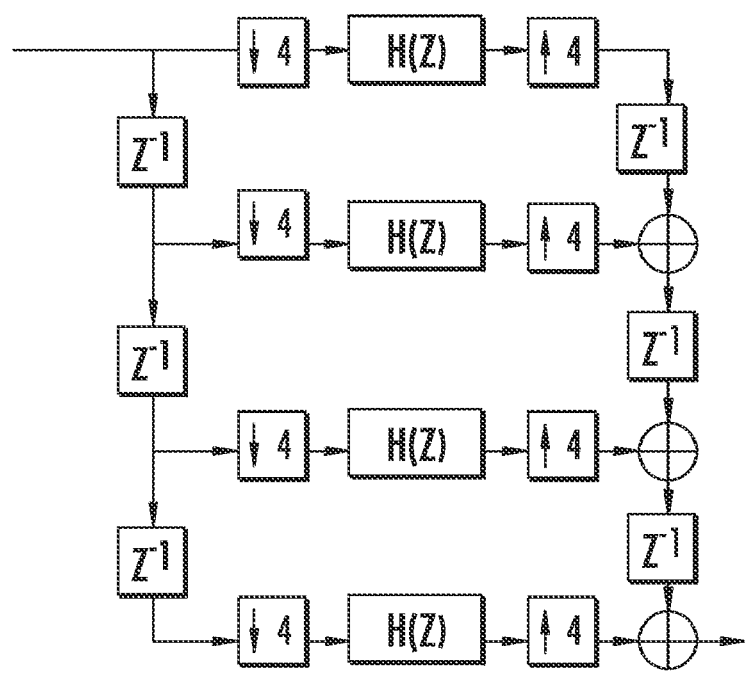

The magnitude response of this filter, viz., $G(z^2)$ is shown in FIG. 27. It is evident from the magnitude response that the notch frequencies are $\pi/4$ and $3\pi/4$. Again, let us look at a four-channel ADC from a multi-rate perspective with the notch filter given by $H(z^4)$. FIG. 28(*a*) shows the four-channel structure while FIG. 28(*b*) shows the equivalent structure modified by the property of the Noble Identity. Again, it can be seen the H(z) is the basic filter that provides the notch filtering of all the GPPF.

Extending this theory to the case of M-channel interleaved ADC, one can arrive at the structure shown in FIG. 2 wherein each notch filter characterized by Eqn 26 is used.

Figure 29:
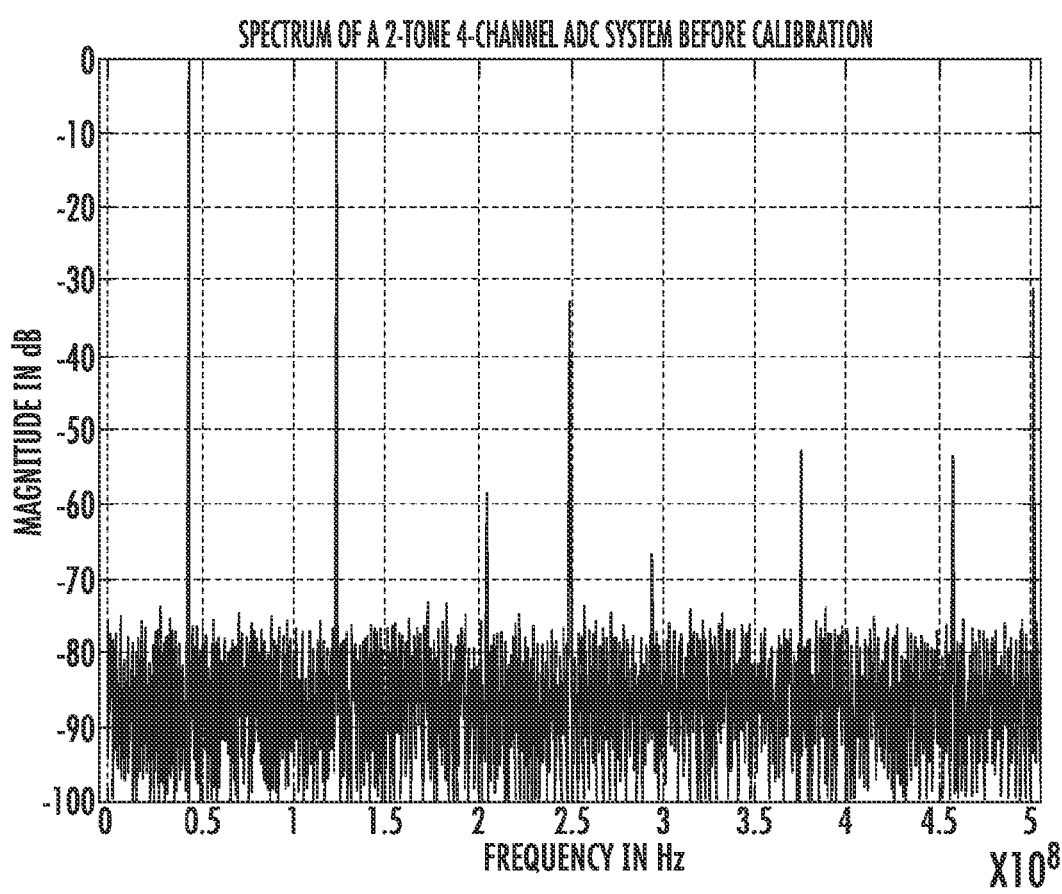
FIG. 29 illustrates a spectrum of a two-tone signal with a tone at Fs/8 before calibration.
Figure 30:
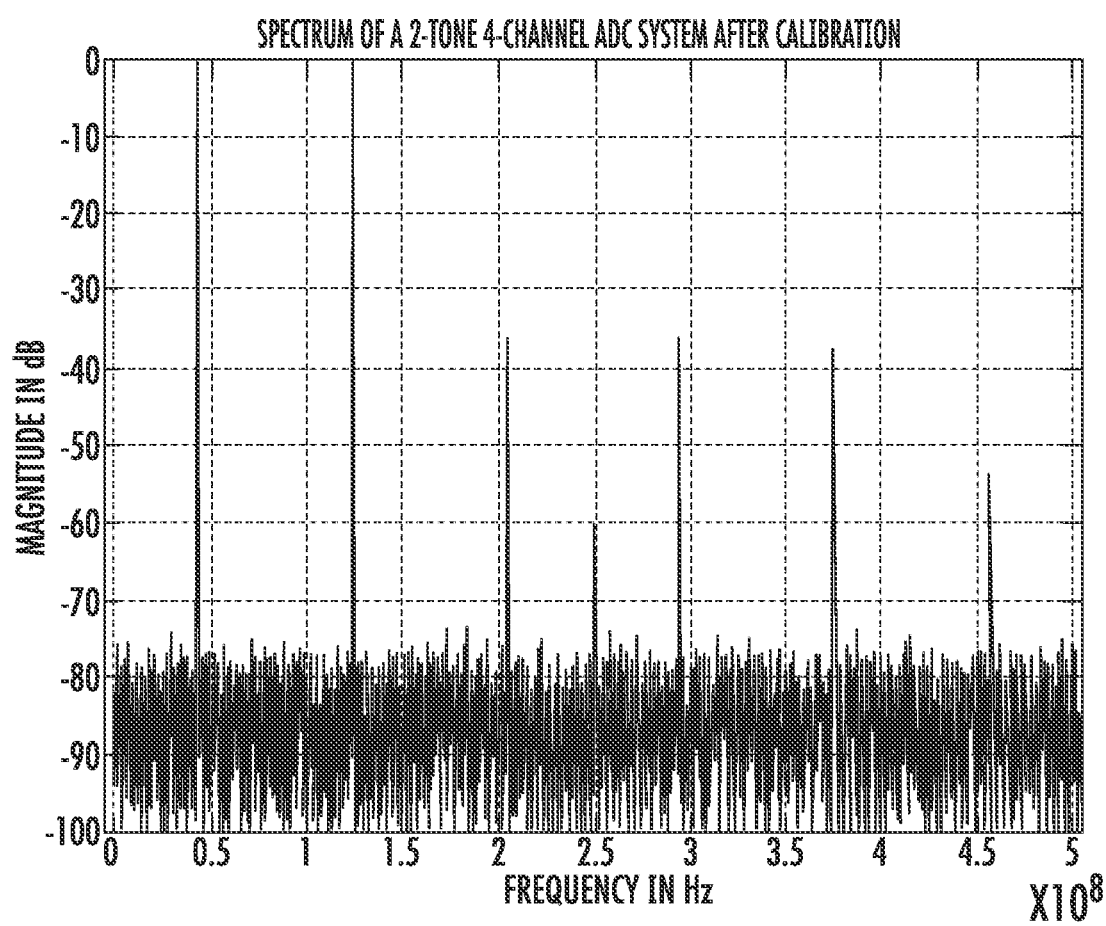
FIG. 30 illustrates a spectrum of a two-tone signal with a tone at Fs/8 after calibration without the notch filter.

A simulation demonstrated the usefulness of the notch filter in a four-channel time-interleaved ADC. In this simulation, a two-tone signal was considered, with one tone at 125 MHz, i.e. at Fs/8 where $F_S=1$ GHz, and the other at any arbitrary location. Here the other tone was chosen at 45.123 MHz. FIG. 29 shows the spectrum of the signal with offset, gain and phase spurs. As can be seen from that figure, for the input tone at $F_S/8$, the gain and phase spur appear at $F_S/8$, $F_S/4$ and $3F_S/8$. The input tone at 45.123 MHz produces gain and phase spurs at approximately 205 MHz, 295 MHz and 455 MHz. There is also a tone at 250 MHz due to offset spur. FIG. 30 shows the spectrum after 15000 iterations of the algorithm. Here the notch filter was not used. As can be seen from the figure, the offset algorithm performs fairly well and hence the tone at 250 MHz has been reduced. However, all the other spurs still exist.

Figure 31:
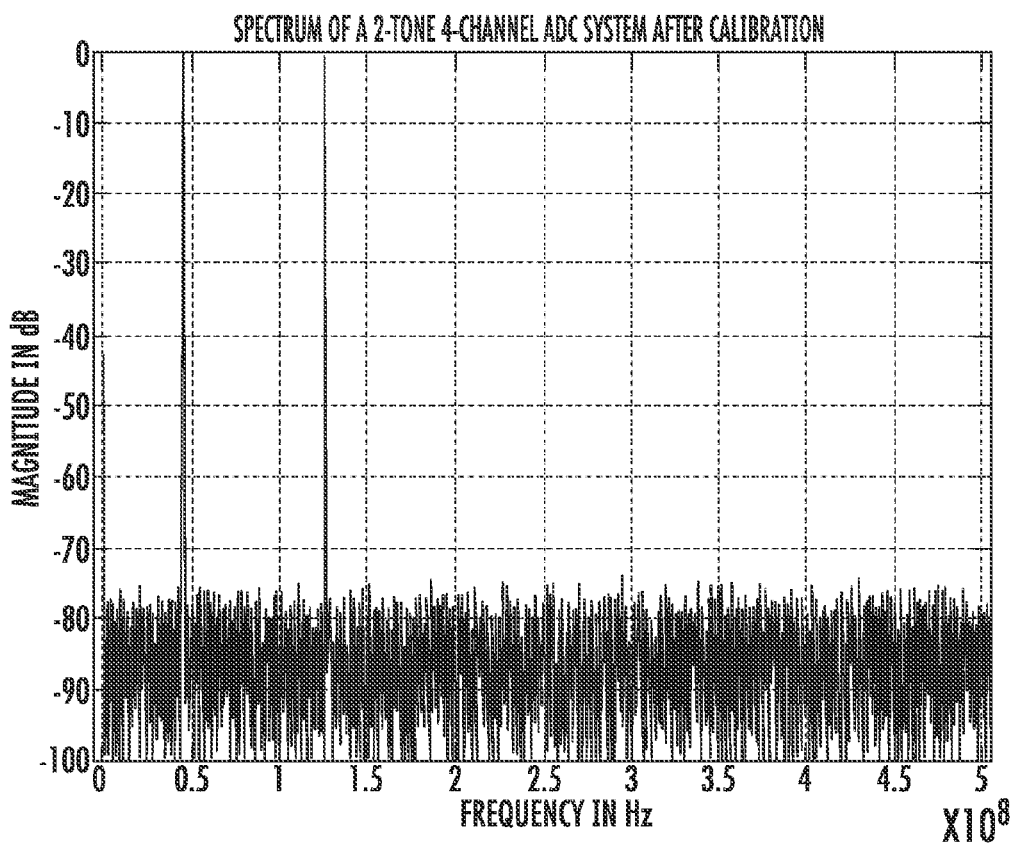
FIG. 31 illustrates a spectrum of a two-tone signal with a tone at Fs/8 after calibration with the notch filter.

FIG. 31 shows the spectrum after 15000 iterations where the notch filter has been used. As can be seen from the figure, all the spurs have been reduced significantly.

High sample rate, time interleaved ADCs such as that described above can find application in many different types of systems. One such application is the receivers used in communication systems. Such receivers have historically used analog tuner devices to demodulate a small portion of the input signal spectrum down to a low frequency. Relatively speaking, the tuner output has a low center frequency and low total bandwidth, thus allowing a low speed analog-to-digital converter to be used to digitize the data.

Certain popular communication system receivers such as that used in cable modem and set-top-box systems are trending toward processing more channels to provide faster broadband access and more video services to the home. One alternative to having a tuner for each channel is to digitize the entire bandwidth of the cable system. Once this is achieved, the number of channels decoded from the spectrum is completely defined in the digital domain. Thus the incremental cost for each additional channel is relatively low and should decrease rapidly over time as digital process technology advances. Digitizing the entire bandwidth of the cable system requires a very high sampling rate; therefore, an interleaved system may provide advantages over other conversion techniques. The increasing need for a wideband spectrum incorporating frequency multiplexed signals makes cable and other communication systems an excellent application of this invention.

FIG. 32 shows an example communication device, such as cable gateway 3100 connected to a cable network 3108, which may be a coaxial, optical fiber, or hybrid fiber/coaxial cable television (CATV) network. The cable gateway 3100 transmits data to and receives data from customer premises equipment 3112. Typically, customer premises equipment 112 includes computers, televisions, and telephones. The cable gateway 100 disclosed herein can be configured to operate according to any suitable specification for transmitting and receiving data, including but not limited to DOCSIS 3.0, Comcast RNG, SCTE 40, T3/S10 ATSC, or OpenCable specifications. Certain specifications require cable modems and cable gateways to tune multiple channels at the same time for receiving television, voice, and data signals. (For example, DOCSIS 3.0 specifies the ability to independently tune at least four channels.) The ability to tune multiple channels is also necessary to watch different television channels on different televisions.

Unlike conventional cable gateways, the cable gateway 3100 shown in FIG. 32 uses a wideband, multi-channel, time-interleaved, analog-to-digital converter (MCTIADC) 3206 to digitize signals received from the cable network 3108. The output from the wideband ADC 3206 can be tuned digitally, rather than with analog tuners, resulting in lower power consumption compared to alternative methods. More particularly, in the example cable gateway 3100, signals transmitted to and from the cable network 3108 are coupled via a diplexer 3202, which separates downstream signals 3220 from upstream signals 3222. In general, CATV networks are asymmetric networks: the bandwidth dedicated to the downstream signals 3220 is greater than the bandwidth dedicated to the upstream signals 3222.

The diplexer 3202 directs downstream traffic to a variable-gain amplifier (VGA) 3204, which amplifies the received signal before transmitting it through a filter 3205 to a wideband time-interleaved ADC 3206. The time-interleaved ADC 3206 digitizes the received signal, then passes the digitized downstream signals 3240 to a digital tuner and quadrature-amplitude-modulation (QAM) or other type demodulator 3208. (Alternative embodiments may use other suitable modulation schemes.) In some embodiments, the digital tuner and QAM demodulator 3208 tunes and demodulates the amplified, filtered, and digitized downstream signals 3240 in accordance with either 64-QAM or 256-QAM techniques to recover the underlying information.

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus comprising:
    a plurality, M, of Analog to Digital Converters (ADCs) coupled to convert an input signal to a set of ADC outputs as M digital values, each of the ADCs having at least one of an offset correction input, a gain correction input, or a phase correction input;
    an adaptive processor, coupled to receive the M digital values, the adaptive processor estimating one or more correction signals for at least one of offset, gain, or phase error in at least one of the M ADCs, the adaptive processor determining the correction signals by:
        accumulating two or more of the M digital values over time, to provide M accumulated values, $X_k$, for k=1 to M;
        determining a reference value, $X_{mean}$, from a combination of the M accumulated values;
        providing an adjusted set of set of digital values from the M accumulated values, $X_k$, and the reference value $X_{mean}$;
        from the adjusted set of digital values, determining at least one of an offset, gain or phase correction value corresponding to one or more estimated correction signals to be applied to correct at least one of offset, gain, or phase error of at least one of the ADCs;
        the estimated correction signals connected to a corresponding at least one of the offset, gain, or correction input of at least one of the ADCs; and
    a multiplexer, for interleaving the M digital values output by the ADCs to form a digital representation of the input signal.

2. The apparatus of claim 1 additionally comprising:
    one or more notch filters, coupled to the ADCs, to filter spur frequency content in the M digital values resulting from at least one of the gain or phase error.

3. The apparatus of claim 1 wherein the adaptive processor further determines the offset correction value by determining an accumulated offset $E^{offset}_k$, for k=1 to M, for each of the plurality, M, of ADCs.

4. The apparatus of claim 1 wherein the adaptive processor further determines the gain correction value by determining an accumulated gain $E^{gain}_k$, for k=1 to M, for each of the plurality, M, of ADCs.

5. The apparatus of claim 1 wherein the adaptive processor further determines the phase correction value by determining an accumulated phase $E^{phase}_k$, for k=1 to M, for each of the plurality, M, of ADCs.

6. The apparatus of claim 1 wherein the adaptive processor sequentially determines the offset, gain, and phase correction values.

7. The apparatus of claim 1 further including a pluralality of digital-to-analog converters (DACs), where each DAC converts at least one of an offset, gain, or phase correction value to an analog signal input to at least one of the offset, gain, or phase inputs to the plurality, M, of ADCs.

8. The apparatus of claim 1 further including additional adaptive processors, the adaptive processors configured to process offset, gain, and phase correction values in parallel.

9. The apparatus of claim 3 wherein the adaptive processor further determines the offset correction value and further comprises:
    a signum block for determining a sign of the offset error;
    a multiplier for multiplying the output of the signum block by an step size;
    a feedback loop for summing and delaying an output of the multiplier;
    a rounding block for rounding an output of the feedback loop; and
    an offset biasing block for biasing the output of the rounding block by an offset bias amount.

10. The apparatus of claim 4 wherein the adaptive processor further determines the gain correction value and further comprises:
    a signum block for determining a sign of the gain error;
    a multiplier for multiplying the output of the signum block by an gain step size;
    a feedback loop for summing and delaying an output of the multiplier;
    a rounding block for rounding an output of the feedback loop; and
    a gain biasing block for biasing the output of the rounding block by a gain bias amount.

11. The apparatus of claim 5 wherein the adaptive processor further determines the phase correction value and further comprises:
    a signum block for determining a sign of the phase error;
    a multiplier for multiplying the output of the signum block by a phase step size;
    a feedback loop for summing and delaying an output of the multiplier;
    a rounding block for rounding an output of the feedback loop; and
    a phase biasing block for biasing the output of the phase rounding block by a phase bias amount.

12. The apparatus of claim 1 additionally comprising:
a receiver, for receiving the input signal from a communication system.

13. The apparatus of claim 1 additionally comprising:
a diplexer, coupled to receive a cable signal from a cable network, and to provide a received cable signal;
a variable gain amplifier, for amplifying the received cable signal and to provide an amplified cable signal; and
a filter, connected to filter the amplified cable signal to provide the input signal to the plurality, M, of ADCs.

14. A method comprising the steps of:
converting an input analog signal to M digital signals via M individual ADC operations, to generate a set of ADC outputs as M digital values, each of the M individual ADC operations having at least one of an offset correction input, a gain correction input, or a phase correction input;
estimating one or more correction signals for at least one of offset, gain, and phase error in at least one of the M ADC operations, via the further steps of:
 accumulating two or more of the M digital values over time, to provide M accumulated values, $X_k$, for k=1 to M;
 determining a reference value, $X_{mean}$, from a combination of the M accumulated values;
 providing an adjusted set of set of digital values from the M accumulated values, $X_k$, and the reference value $X_{mean}$;
 from the adjusted set of digital values, determining at least one of an offset, gain or phase correction value corresponding to one or more estimated correction signals to be applied to correct at least one of offset, gain, or phase error of at least one of the ADC operations;
 coupling the estimated correction signals to at least one offset, gain, or phase correction input of the at least one of the M individual ADC operations; and
 interleaving the M digital values output by the ADCs to form a digital representation of the input signal.

15. The method of claim 14 additionally comprising:
applying one or more notch filter operations to the outputs of the ADCs, to filter spur frequency content in the M digital values resulting from at least one of the gain or phase error.

16. The method of claim 14 further comprising:
determining the offset correction values by determining an accumulated offset, $E^{offset}_k$, for k=1 to M, for each of the plurality of ADC operations.

17. The method of claim 14 further comprising:
determining the gain correction value by determining an accumulated gain error, $E^{gain}_k$, for k=1 to M, for each of the plurality of ADC operations.

18. The method of claim 14 further comprising:
determining the phase correction value by determining an accumulated phase error $E^{phase}_k$, for k=1 to M, for each of the plurality of ADC operations.

19. The method of claim 14 further comprising;
sequentially determining the offset, gain, and phase correction values.

20. The method of claim 14 further comprising:
Digital to Analog converting at least one of an offset, gain, or phase correction value to one or more analog input signals; and
coupling the analog input signals to at least one of the offset, gain, or phase inputs of at least one of the plurality, M, of ADCs.

21. The method of claim 14 further comprising:
processing each of the offset, gain, and phase correction values in parallel.

22. The method of claim 16 further comprising:
determining a sign of the offset error;
multiplying the output of the signum block by an step size;
summing and delaying an output of the multiplier;
rounding an output of the feedback loop; and
biasing the output of the rounding block by an offset bias amount.

23. The method of claim 17 further comprising:
determining a sign of the gain error;
multiplying the output of the signum block by an gain step size;
summing and delaying an output of the multiplier;
rounding an output of the feedback loop; and
biasing the output of the rounding block by a gain bias amount.

24. The method of claim 18 further comprising:
determining a sign of the phase error;
multiplying the output of the signum block by a phase step size;
summing and delaying an output of the multiplier;
rounding an output of the feedback loop; and
biasing the output of the phase rounding block by a phase bias amount.

25. The method of claim 14 additionally comprising:
receiving the input signal from a communication system.

26. The method of claim 14 additionally comprising:
receiving a cable signal from a cable network, to provide a received cable signal;
amplifying the received cable signal to provide an amplified cable signal; and
filtering the amplified cable signal to provide the input signal to the plurality, M, of ADCs.

* * * * *